(12) United States Patent
Motoyama et al.

(10) Patent No.: US 12,342,726 B2
(45) Date of Patent: Jun. 24, 2025

(54) ETCHING OF MAGNETIC TUNNEL JUNCTION (MTJ) STACK FOR MAGNETORESISTIVE RANDOM-ACCESS MEMORY (MRAM)

(71) Applicant: International Business Machines Corporation, Armonk, NY (US)

(72) Inventors: Koichi Motoyama, Clifton Park, NY (US); Oscar van der Straten, Guilderland Center, NY (US); Joseph F. Maniscalco, Greenville, SC (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 454 days.

(21) Appl. No.: 17/520,672

(22) Filed: Nov. 7, 2021

(65) Prior Publication Data

US 2023/0144157 A1    May 11, 2023

(51) Int. Cl.
*H10N 50/01*    (2023.01)
*H10B 61/00*    (2023.01)
*H10N 50/80*    (2023.01)

(52) U.S. Cl.
CPC .............. *H10N 50/01* (2023.02); *H10B 61/00* (2023.02); *H10N 50/80* (2023.02)

(58) Field of Classification Search
CPC ........ H10N 50/01; H10N 50/80; H10N 50/10; H10B 61/00
See application file for complete search history.

(56) References Cited

U.S. PATENT DOCUMENTS

| | | | |
|---|---|---|---|
| 8,048,685 B2 | 11/2011 | Boivin | |
| 9,425,387 B1 | 8/2016 | Liu | |
| 9,553,257 B1 | 1/2017 | Annunziata | |
| 10,134,981 B1 | 11/2018 | Yang | |
| 10,516,102 B1 * | 12/2019 | Yang | H10N 50/10 |
| 10,522,740 B2 | 12/2019 | Chuang | |
| 10,522,741 B1 | 12/2019 | Yang | |
| 10,529,916 B2 | 1/2020 | Huang | |
| 2010/0181633 A1 * | 7/2010 | Nam | H01F 10/3254 |
| | | | 257/E29.323 |
| 2016/0308119 A1 | 10/2016 | Hsu | |
| 2016/0351806 A1 * | 12/2016 | Hsieh | H10N 70/068 |
| 2017/0117467 A1 * | 4/2017 | Chang | H10N 70/826 |

(Continued)

FOREIGN PATENT DOCUMENTS

EP    3084766 B1    8/2018

*Primary Examiner* — Yara B Green
*Assistant Examiner* — Akhee Sarker-Nag
(74) *Attorney, Agent, or Firm* — Edward J. Wixted, III

(57) ABSTRACT

Embodiments of the invention include a method for fabricating a semiconductor device and the resulting structure. A first set of spacers are formed on the sidewalls of a bottom electrode. A reference layer is formed on the spacers and the bottom electrode. A second set of spacers are formed on the sidewalls of the first set of spacers and the reference layer. A tunnel barrier is formed on the reference layer and the second set of spacers. A free layer is formed on the tunnel barrier, where a width of the free layer is greater than a width of the reference layer. A metal hardmask is formed on the free layer. A third set of spacers are formed on the sidewalls of the metal hardmask, the free layer, the tunnel barrier, and the second set of spacers.

7 Claims, 18 Drawing Sheets

(56) References Cited

U.S. PATENT DOCUMENTS

| | | | |
|---|---|---|---|
| 2020/0075840 A1* | 3/2020 | Feng | H01L 23/53228 |
| 2020/0083040 A1* | 3/2020 | Mont | H01L 21/02581 |
| 2020/0185598 A1* | 6/2020 | Noh | H10N 50/10 |
| 2020/0235286 A1 | 7/2020 | Marchack | |
| 2020/0295254 A1 | 9/2020 | Diaz | |
| 2020/0365795 A1* | 11/2020 | Chuang | H10N 50/01 |
| 2021/0091139 A1* | 3/2021 | Tseng | H10N 50/10 |
| 2021/0091302 A1* | 3/2021 | Reznicek | H10N 50/80 |
| 2023/0062842 A1* | 3/2023 | Huang | H10N 50/01 |

\* cited by examiner

ETCHING OF MAGNETIC TUNNEL JUNCTION (MTJ) STACK FOR MAGNETORESISTIVE RANDOM-ACCESS MEMORY (MRAM)

BACKGROUND

The present invention relates generally to the field of magnetoresistive random-access memory (MRAM) devices and fabrication, and more particularly to the fabrication of a MRAM device that has a free layer with a larger width than a corresponding reference layer.

MRAM is a type of non-volatile random-access memory (RAM) which stores data in magnetic domains. Unlike conventional RAM technologies, data in MRAM is not stored as electric charge or current flows, but by magnetic storage elements formed from two ferromagnetic plates, each of which can hold a magnetization, separate by a thin insulating layer. One of the two plates is a permanent magnet set to a particular polarity. The other plate's magnetization can be changed to match that of an external field to store memory.

A magnetic tunnel junction (MTJ) includes two layers of magnetic metal separated by an ultrathin layer of insulator. The insulating layer is so thin that electrons can tunnel through the barrier if a bias voltage is applied between the two metal electrodes. MTJs are used in MRAM.

SUMMARY

Embodiments of the invention include a method for fabricating a semiconductor device and the resulting structure. A first set of spacers are formed on the sidewalls of a bottom electrode. A reference layer is formed on the spacers and the bottom electrode. A second set of spacers are formed on the sidewalls of the first set of spacers and the reference layer. A tunnel barrier is formed on the reference layer and the second set of spacers. A free layer is formed on the tunnel barrier, where a width of the free layer is greater than a width of the reference layer. A metal hardmask is formed on the free layer. A third set of spacers are formed on the sidewalls of the metal hardmask, the free layer, the tunnel barrier, and the second set of spacers.

Embodiments of the invention also include another method for fabricating a semiconductor device and the resulting structure. A reference layer is formed on a bottom electrode. A first set of spacers are formed on the sidewalls of the reference layer and the bottom electrode. A tunnel barrier is formed on the reference layer and the first set of spacers. A free layer is formed on the tunnel barrier, where a width of the free layer is wider than a width of the reference layer. A metal hardmask is formed on the free layer. A second set of spacers are formed on the sidewalls of the metal hardmask, the free layer, the tunnel barrier, and the first set of spacers.

DETAILED DESCRIPTION

Figure 1:
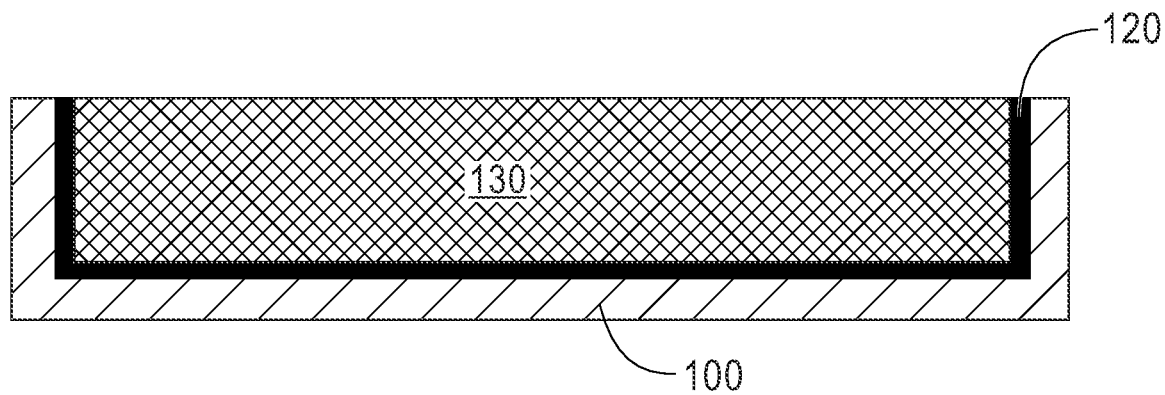
FIG. 1 depicts a process of forming a bottom metal contact on a liner and substrate, in accordance with an embodiment of the invention.

Embodiments of the present invention recognize that for high performance magnetoresistive random-access memory (MRAM) cells or devices that are based on perpendicular magnetic tunnel junction (MTJ) structures, well-defined interfaces and interface control are essential. Embodiments of the present invention recognize that MTJ structures typically include a Co-based synthetic antiferromagnet (SAF), a CoFeB based reference layer, a MgO based tunnel barrier, a CoFeB based free layer, and cap layers containing, for example, Ta and/or Ru. Embodiments of the present invention recognize that embedded MTJ structures are usually formed by the patterning of blanket MTJ stacks. Embodiments of the present invention recognize that reactive ion etching (RIE) and ion beam etching (IBE) processing of such MTJ stacks presents a challenge and typically leads to shorts due to resputtering of thick bottom metal layers onto MTJ stack sidewalls. Embodiments of the present invention recognize a need for embedded MTJ structures formed by approaches that have a reduced risk of shorts due to metal resputtering.

Embodiments of the present invention describe MRAM stack structure with a recessed reference layer. In general, embodiments of the present invention describe an MRAM structure with a reference layer that has a width equal to or greater than the bottom electrode. Further, embodiments of the present invention describe an MRAM structure with a reference layer that has a width smaller than the free layer. Embodiments of the present invention further describe an MRAM structure that has sidewall encapsulation of the MRAM pillar, encapsulating at least the reference layer and the bottom electrode using, for example, encapsulation materials such as silicon nitride (SiN), SiCN, or SiNCH.

Embodiments of the present invention recognize that that such an MRAM structure improves performance and extends scalability of embedded MRAM due to reduced tunnel barrier shorts.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention will now be described in detail with reference to the Figures.

FIG. 1 depicts a cross-sectional view of a device at an early stage in the method of forming the device and after an initial set of fabrication operations according to one embodiment of the present invention. FIG. 1 shows the formation of bottom metal contact 130 on liner 120, liner 120 between bottom metal contact 130 and substrate 100.

Substrate 100 may be interlayer dielectric (ILD) material. The ILD may be a non-crystalline solid material such as silicon dioxide ($SiO_2$) undoped silicate glass (USG), fluorosilicate glass (FSG), borophosphosilicate glass (BPSG), a spin-on low-K dielectric layer, a chemical vapor deposition (CVD) low-K dielectric layer or any combination thereof. The term "low-K" as used throughout the present application denotes a dielectric material that has a dielectric constant of less than silicon dioxide. In another embodiment, a self-planarizing material such as a spin-on glass (SOG) or a spin-on low-K dielectric material such as SiLK™ can be used as the ILD. The use of a self-planarizing dielectric material as the ILD may avoid the need to perform a subsequent planarizing step.

In some embodiments, the ILD can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD, a planarization process or an etch back process follows the deposition of the dielectric material that provides the ILD.

In some embodiments, substrate 100 may merely be a simple representation of an underneath device that may comprise, for example, front-end-of-line (FEOL) devices (e.g., transistors, capacitors, resistors). The particular composition of substrate 100 may vary based on the type of device desired.

Liner 120 may be formed in substrate 100 by removing portions of substrate 100 to form a bottom metal contact trench. The trench may be formed in substrate 100 based on the desired size and location of the liner 120.

In embodiments of the present invention, each trench may be formed by an etching process or a selective etching process that selectively removes substrate 100 material from substrate 100 within the trench. In some embodiments, this etching can be performed using an anisotropic etch such as reactive ion etching (RIE). Masking material (not shown) may be applied to the top of the device, prior to etching each contact trench, which resists etching and can be utilized to form the desired shape of the contact trench, such as, for example, the shape depicted in FIG. 1. In some embodiments, the masking material may be a photoresist which has been patterned using photolithography.

Subsequent to creating the trench, liner 120 is formed on substrate 100 by sputtering, chemical vapor chemical vapor deposition (CVD), or atomic layer deposition (ALD) and is a conductor such as titanium nitride (TiN), titanium aluminum carbine (TiAlC), titanium carbine (TiC), or tantalum nitride (TaN). In some embodiments, liner 220 may be comprised of other conductive materials such as aluminum (Al), copper (Cu), nickel (Ni), cobalt (Co), ruthenium (Ru), or combinations thereof.

Bottom metal contact 130 includes contacts and/or vias for sending and reading signals to transistors in the FEOL layer. Bottom metal contact 130 is made of an electrically conductive material such as metal, and certain embodiments of bottom metal contact 130 may include copper. Bottom metal contact 130 may be formed of a metal such as, for example, tungsten, tantalum, hafnium, zirconium, niobium, titanium, titanium nitride, copper, or alloys comprising carbon. Any known deposition process may be utilized including, for example, chemical vapor deposition (CVD), plasma enhanced chemical vapor deposition (PECVD), physical vapor deposition (PVD), sputtering, ALD or other like deposition processes. After the metal used to form bottom metal contact 130 is deposited, a chemical-mechanical planarization (CMP) process may be used to remove excess contact material stopped at the top surface of substrate 100.

Figure 2:
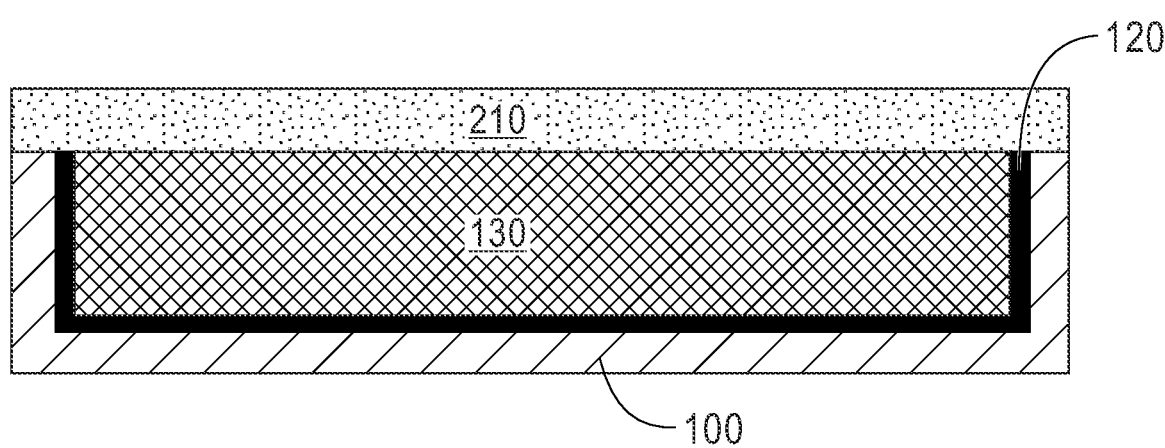
FIG. 2 depicts a process of forming a bottom electrode, in accordance with an embodiment of the invention.

FIG. 2 depicts a cross-sectional view of fabrication steps, in accordance with an embodiment of the present invention. FIG. 2 shows the formation of bottom electrode 210.

Bottom electrode 210 is deposited on the top surface of the structure depicted in FIG. 1. Bottom electrode 210 may be formed by any known deposition process including, for example, CVD, PECVD, PVD, sputtering, ALD, or other like deposition processes. Bottom electrode 210 can be formed from conductor such as TaN, tungsten nitride (WN), titanium nitride (TiN), titanium aluminum carbine (TiAlC), or titanium carbine (TiC). In some embodiments, bottom electrode 210 may be comprised of other conductive materials such as aluminum (Al), copper (Cu), nickel (Ni), cobalt (Co), ruthenium (Ru), or combinations thereof.

Figure 3:
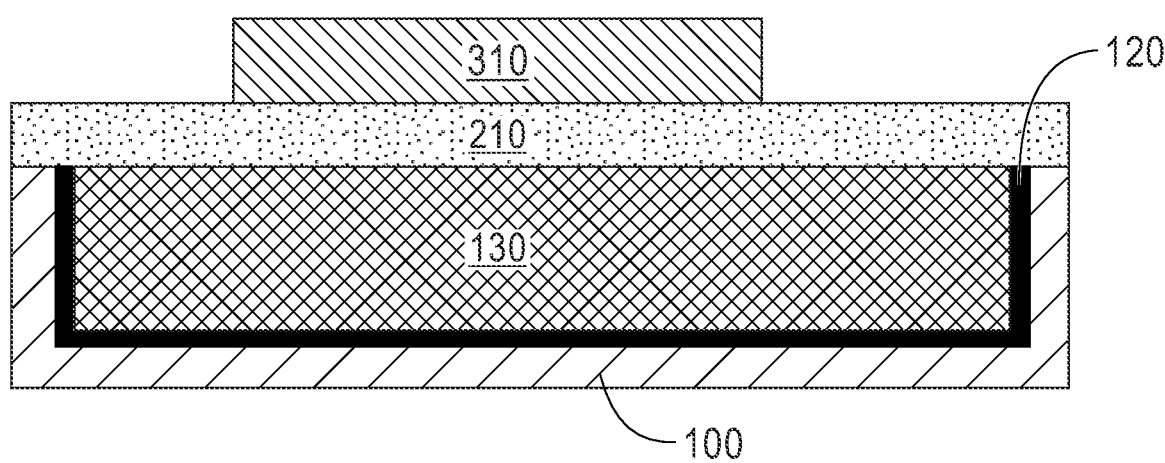
FIG. 3 depicts a process of forming a hardmask, in accordance with an embodiment of the invention.

FIG. 3 depicts a cross-sectional view of fabrication steps, in accordance with an embodiment of the present invention. FIG. 3 shows the formation of hardmask 310.

Hardmask 310 may be any hardmask material such as, for example, silicon dioxide and/or SiN. Hardmask 310 can be formed by forming a blanket layer of material by any suitable deposition process such as, for example, chemical vapor deposition (CVD) or plasma enhanced chemical vapor deposition (PECVD).

After forming hardmask 310, lithography and etching can be used to pattern hardmask 310 such that the top surface of portions of bottom electrode 210 are exposed.

Figure 4:
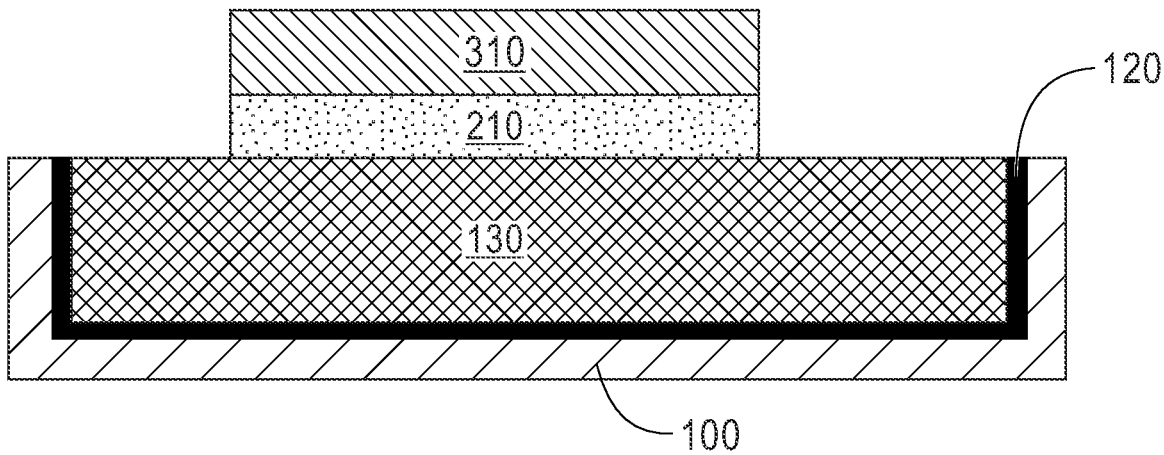
FIG. 4 depicts a process of removing portions of a bottom electrode not protected by a hardmask, in accordance with an embodiment of the invention.

FIG. 4 depicts a cross-sectional view of fabrication steps, in accordance with an embodiment of the present invention. FIG. 4 shows the removal of portions of bottom electrode 210 not protected by hardmask 310.

The removing of portions of bottom electrode 210 not protected by hardmask 310 can be performed using an anisotropic etching process such as, for example, RIE. The portion of bottom electrode 210 that remains corresponds to the size of the desired bottom electrode for the device.

Figure 5:
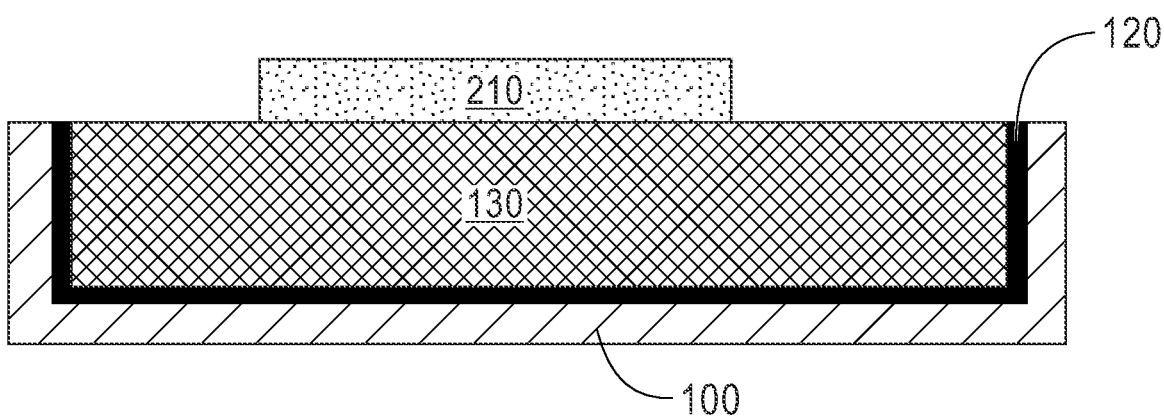
FIG. 5 depicts a process of removing a hardmask, in accordance with an embodiment of the invention.

FIG. 5 depicts a cross-sectional view of fabrication steps, in accordance with an embodiment of the present invention. FIG. 5 shows the removal of hardmask 310.

In general, the process of removing hardmask 310 involves the use of an etching process such as RIE, laser ablation, or any etch process which can be used to selectively remove a portion of material, such as hardmask 310.

Figure 6:
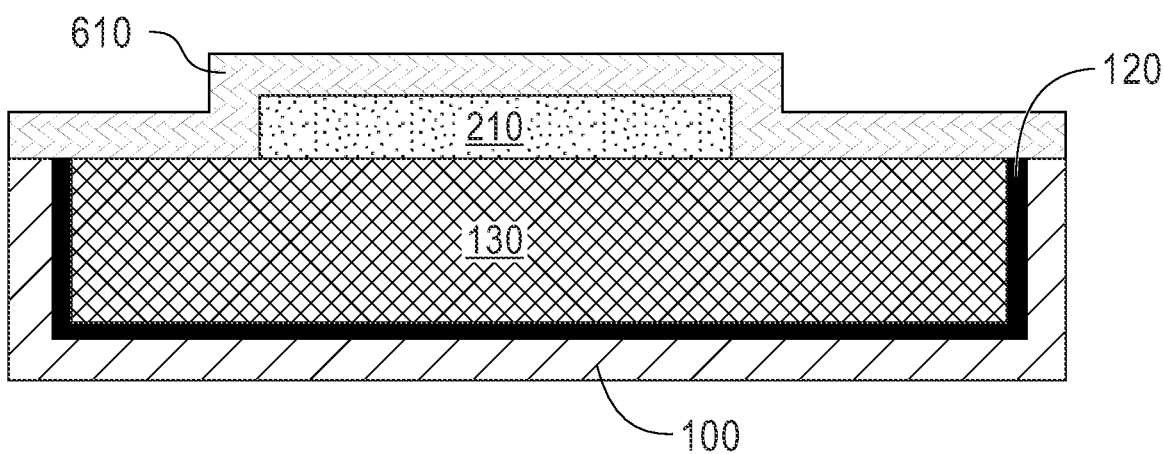
FIG. 6 depicts a process of forming a spacer layer, in accordance with an embodiment of the invention.

FIG. 6 depicts a cross-sectional view of fabrication steps, in accordance with an embodiment of the present invention. FIG. 6 shows the formation of spacer layer 610.

Figure 7:
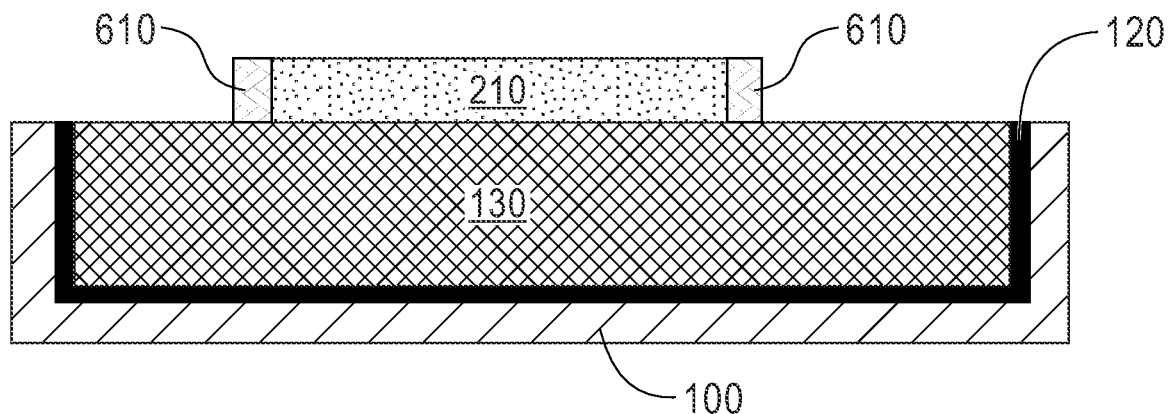
FIG. 7 depicts a process of removing portions of a spacer layer, in accordance with an embodiment of the invention.

Spacer layer 610 can be formed on exposed surfaces by first providing a dielectric spacer material and then, as shown in FIG. 7, etching the dielectric spacer material. One example of a dielectric spacer material that may be employed in embodiments of the present invention is SiN. In general, spacer layer 610 comprises any dielectric spacer material including, for example, a dielectric nitride, dielectric oxide, and/or dielectric oxynitride. More specifically, the spacer layer 610 may be, for example, SiCN, SiNCH, SiBCN, SiBN, SiOCN, SiON, SiCO, or SiC. In one example, the dielectric spacer material is composed of a non-conductive low capacitance dielectric material such as $SiO_2$.

The dielectric spacer material that provides spacer layer 610 may be provided by a deposition process including, for example, chemical vapor deposition (CVD), plasma enhanced chemical vapor deposition (PECVD), or physical vapor deposition (PVD). The etch used to provide spacer layer 610 may comprise a dry etching process such as, for example, reactive ion etching. In some embodiments, spacer layer 610 is formed by sputtering or ALD.

FIG. 7 depicts a cross-sectional view of fabrication steps, in accordance with an embodiment of the present invention. FIG. 7 shows the removal of the horizontal portions of spacer layer 610.

More particularly, portions of dielectric spacer material on the top surfaces of bottom metal contact 130 and bottom electrode 210 are removed such that what remains of spacer layer 610 is present on the sidewalls of bottom electrode 210.

The portions of spacer layer 610 may be removed utilizing a directional or anisotropic etching process such as reactive ion etching (ME). In one example, gas cluster ion beam etching (IBE) may be used to remove spacer layer 610 from the top surfaces of bottom metal contact 130 and bottom electrode 210. The removal of spacer layer 610 from the top surfaces of bottom metal contact 130 and bottom electrode 210 re-exposes the top surfaces of bottom metal contact 130 and bottom electrode 210.

Figure 8:
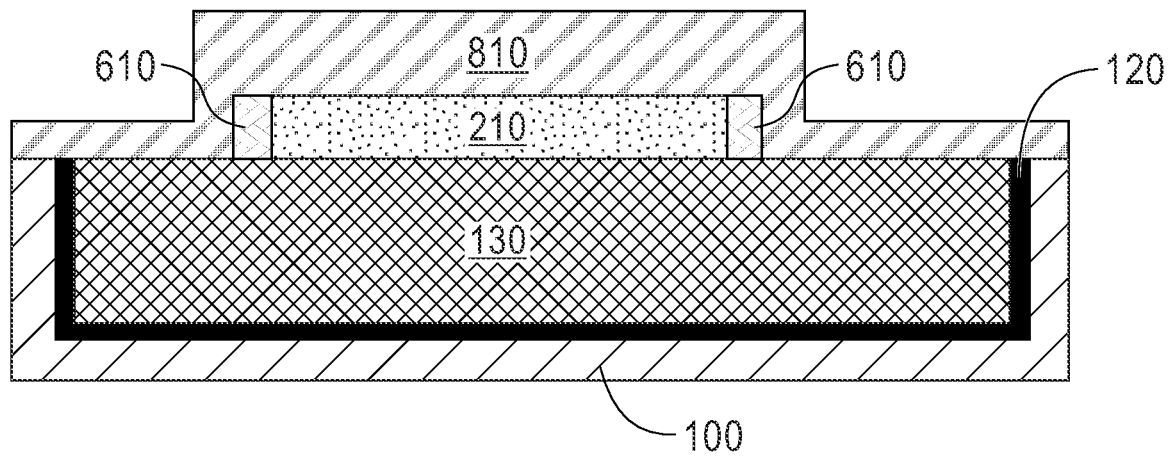
FIG. 8 depicts a process of forming ferromagnetic material used to form a reference layer, in accordance with an embodiment of the invention.

FIG. 8 depicts a cross-sectional view of fabrication steps, in accordance with an embodiment of the present invention. FIG. 8 shows the formation of ferromagnetic material used to form reference layer 810.

Reference layer 810 is a part of an MTJ stack utilized in embodiments of the present invention. In general, an MTJ stack comprises a reference layer, such as reference layer 810 and a free layer, which are both ferromagnets, separated by a tunneling barrier, which is a thin insulator layer through which electrons can quantum-mechanically tunnel from one ferromagnetic layer into the other. A metal hardmask acts as an upper contact for the MTJ stack and bottom electrode 210 and bottom metal contact 130 acts as the lower contact. The magnetization of the reference layer (e.g., reference layer 810) is fixed, while the magnetization direction of the free layer can be switched between two states (i.e., parallel and anti-parallel to the magnetization direction of the reference layer). These different states are then mapped to zero and one.

Reference layer 810 is deposited on exposed surfaces and may be formed by any known deposition process including for example, CVD, PECVD, PVD, sputtering, ALD, or other like deposition processes. Reference layer 810 may be formed of any ferromagnetic material or alloy such as, but not limited to, NiFe, NiFeCo, CoFe, CoFeB, Co, Ni, Cu, Ta, Ti, Zr, Au, Ru, Cr, Pt, CoPt, CoCrPt, FeNi, FeTa, FeTaCr, FeAl, FeZr, NiFeCr, or NiFeX. In general, reference layer 810 comprises a ferromagnetic layer with a fixed magnetization state. In some embodiments, reference layer 810 is composed of multiple sublayers that create a magnetically engineered structure fixing the magnetization orientation with a high magnetic energy barrier. For example, reference layer 810 may comprise a reference magnetic layer coupled with a synthetic anti-ferromagnetic (SAF) layer. A thin coupling layer may be between the reference magnetic layer and the SAF layer.

Figure 9:
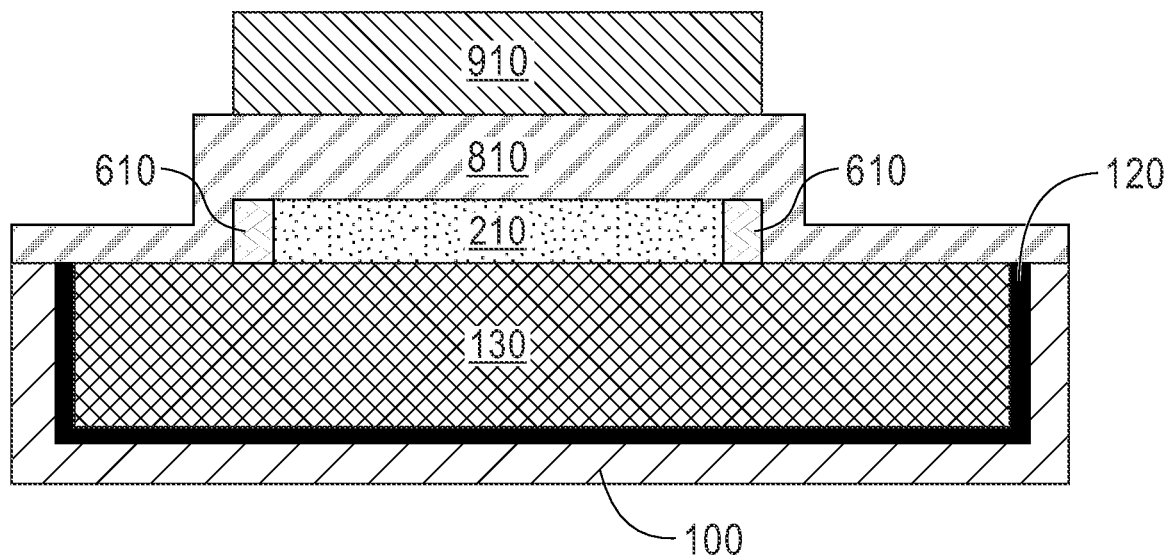
FIG. 9 depicts a process of forming a hardmask, in accordance with an embodiment of the invention.

FIG. 9 depicts a cross-sectional view of fabrication steps, in accordance with an embodiment of the present invention. FIG. 9 shows the formation of hardmask 910.

Hardmask 910 may be any hardmask material such as, for example, silicon dioxide and/or SiN. Hardmask 910 can be formed by forming a blanket layer of material by any suitable deposition process such as, for example, chemical vapor deposition (CVD) or plasma enhanced chemical vapor deposition (PECVD).

After forming hardmask 910, lithography and etching can be used to pattern hardmask 910 such that the top surface of portions of reference layer 810 are exposed. In the depicted embodiment, hardmask 910 is patterned such that the width of hardmask 910 is greater than the width of bottom electrode 210. In some embodiments, hardmask 910 may be patterned such that the width of hardmask 910 is equal to the width of bottom electrode 210.

Figure 10:
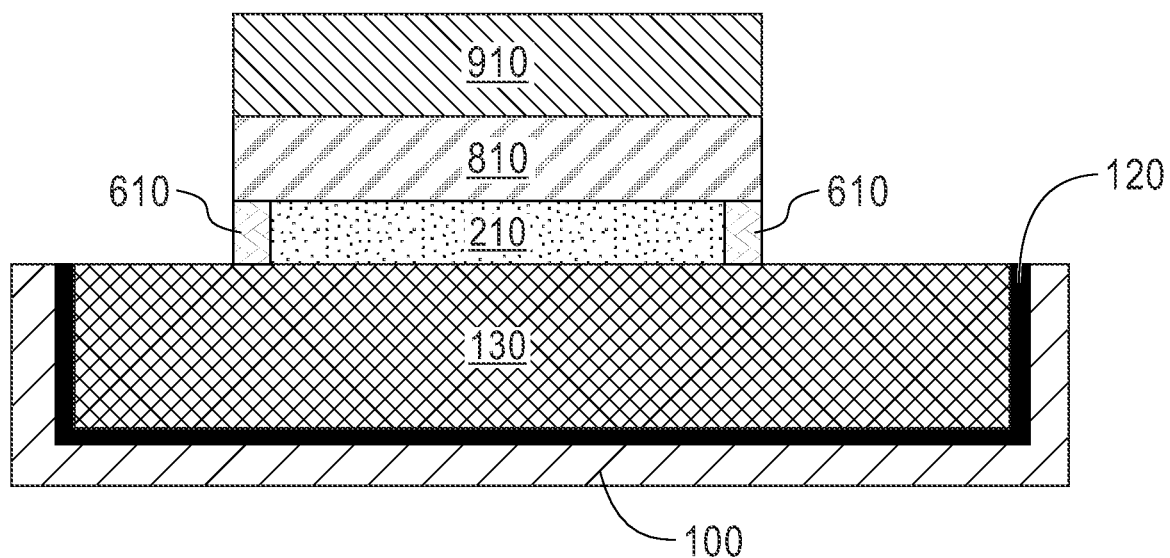
FIG. 10 depicts a process of removing portions of a reference layer not protected by a hardmask, in accordance with an embodiment of the invention.

FIG. 10 depicts a cross-sectional view of fabrication steps, in accordance with an embodiment of the present invention. FIG. 10 shows the removal of portions of reference layer 810 not protected by hardmask 910.

The removing of portions of reference layer 810 not protected by hardmask 910 can be performed using an anisotropic etching process such as, for example, reactive ion etching (RIE). The portion of reference layer 810 that remains corresponds to the size of the desired reference layer for the device.

Figure 11:
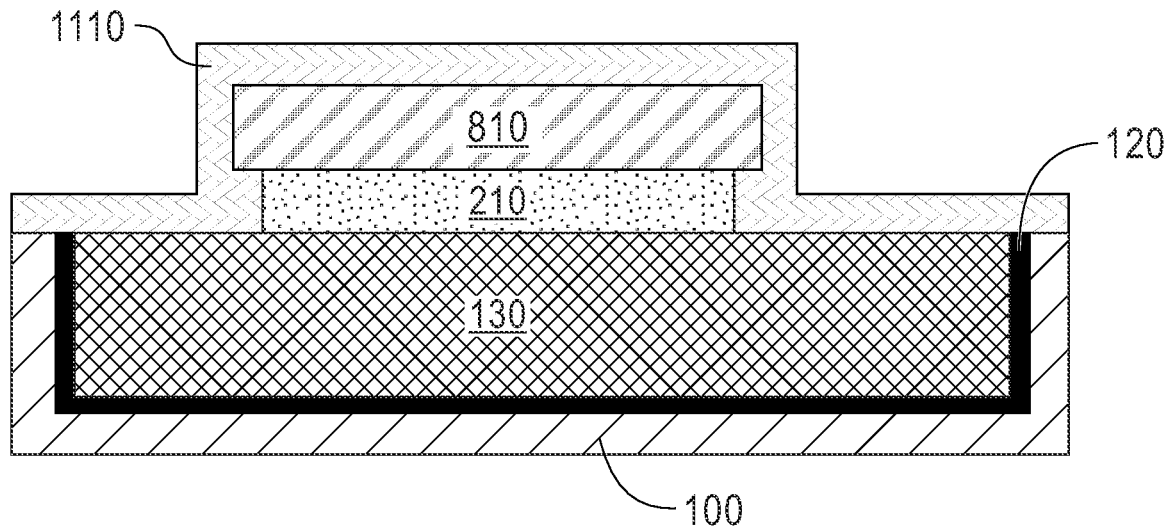
FIG. 11 depicts a process of removing a hardmask and forming a spacer layer, in accordance with an embodiment of the invention.

FIG. 11 depicts a cross-sectional view of fabrication steps, in accordance with an embodiment of the present invention. FIG. 11 shows the removal of hardmask 910 and the formation of spacer layer 1110.

In general, the process of removing hardmask 910 involves the use of an etching process such as RIE, laser ablation, or any etch process which can be used to selectively remove a portion of material, such as hardmask 910.

Figure 12:
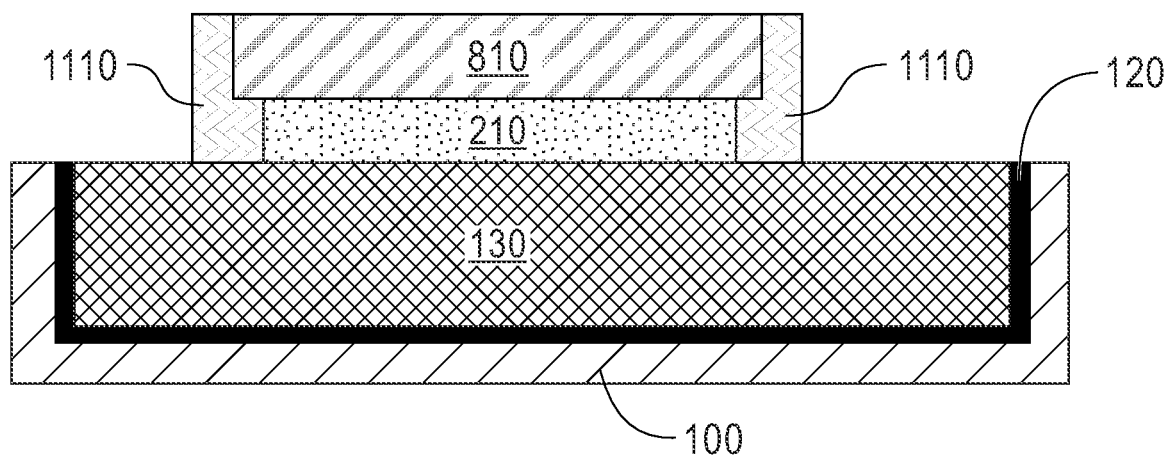
FIG. 12 depicts a process of removing portions of a spacer layer, in accordance with an embodiment of the invention.

Spacer layer 1110 can be formed on exposed surfaces by first providing a dielectric spacer material and then, as shown in FIG. 12, etching the dielectric spacer material. One example of a dielectric spacer material that may be employed in embodiments of the present invention is SiN. In general, spacer layer 1110 comprises any dielectric spacer material including, for example, a dielectric nitride, dielectric oxide, and/or dielectric oxynitride. More specifically, the spacer layer 1110 may be, for example, SiCN, SiNCH, SiBCN, SiBN, SiOCN, SiON, SiCO, or SiC. In one example, the dielectric spacer material is composed of a non-conductive low capacitance dielectric material such as $SiO_2$.

The dielectric spacer material that provides spacer layer 1110 may be provided by a deposition process including, for example, CVD, PECVD, or PVD. The etch used to provide spacer layer 1110 may comprise a dry etching process such as, for example, reactive ion etching. In some embodiments, spacer layer 1110 is formed by sputtering or ALD.

FIG. 12 depicts a cross-sectional view of fabrication steps, in accordance with an embodiment of the present invention. FIG. 12 shows the removal of the horizontal portions of spacer layer 1110.

More particularly, portions of dielectric spacer material on the top surfaces of bottom metal contact 130 and reference layer 810 are removed such that what remains of spacer layer 1110 is present on the sidewalls of reference layer 810.

The portions of spacer layer 1110 may be removed utilizing a directional or anisotropic etching process such as RIE. In one example, gas cluster IBE may be used to remove spacer layer 1110 from the top surfaces of bottom metal contact 130 and reference layer 810. The removal of spacer layer 1110 from the top surfaces of bottom metal contact 130 and reference layer 810 re-exposes the top surfaces of bottom metal contact 130 and reference layer 810.

Figure 13:
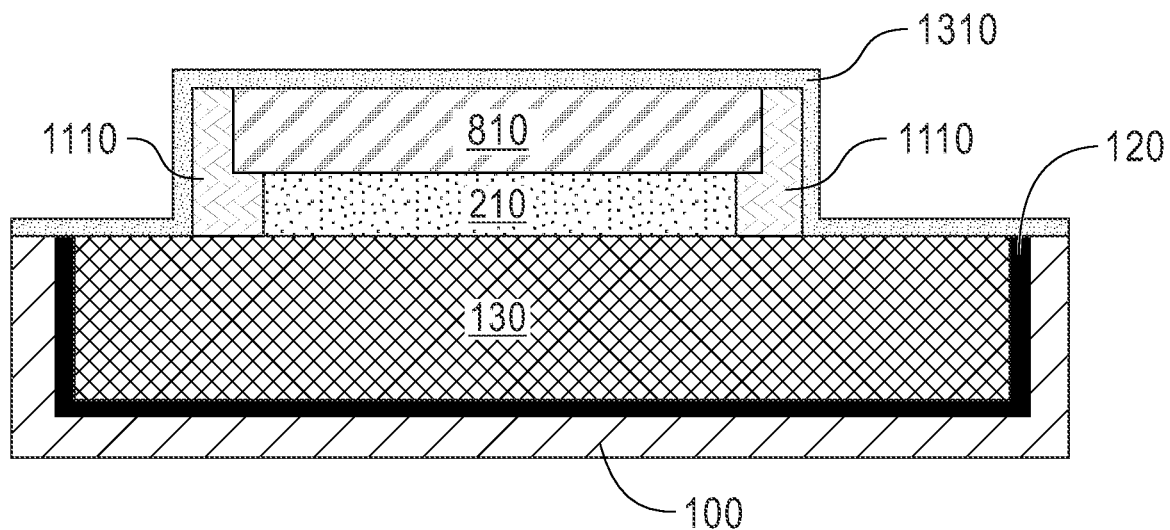
FIG. 13 depicts a process of forming a tunnel barrier, in accordance with an embodiment of the invention.

FIG. 13 depicts a cross-sectional view of fabrication steps, in accordance with an embodiment of the present invention. FIG. 13 shows the formation of tunnel barrier 1310.

Tunnel barrier 1310 is deposited on exposed surfaces. Tunnel barrier 1310 may be formed by any known known deposition process including, for example, CVD, PECVD, PVD, sputtering, ALD, or other like deposition processes. Tunnel barrier 1310 can be formed from an oxide material or other suitable electrical insulator. Tunnel barrier 1310 may be formed of, for example, magnesium oxide (MgO) or aluminum oxide ($Al_2O_3$) Tunnel barrier 1310 is typically very thin, oftentimes only a few nanometers thick, such that electrons can tunnel from one ferromagnet (e.g., a free layer) to the next (e.g., reference layer 810).

Figure 14:
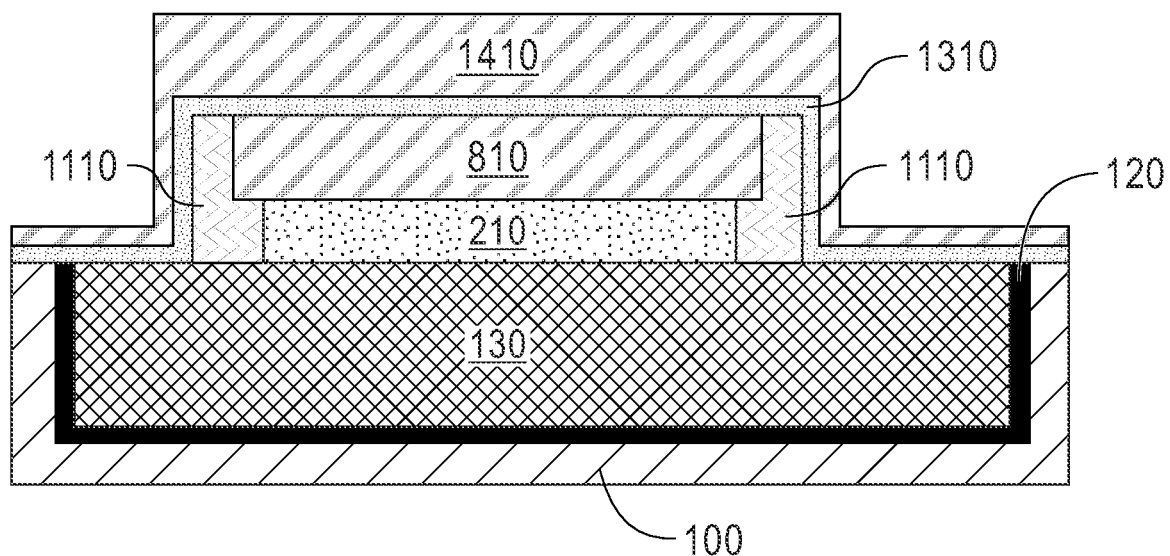
FIG. 14 depicts a process of forming a free layer, in accordance with an embodiment of the invention.

FIG. 14 depicts a cross-sectional view of fabrication steps, in accordance with an embodiment of the present invention. FIG. 14 shows the formation of free layer 1410.

Free layer 1410 is deposited on tunnel barrier 1310. Free layer 1410 may be formed by any known deposition process including, for example, CVD, PECVD, PVD, sputtering, ALD, or other like deposition processes. Free layer 1410 may be formed of any ferromagnetic material or alloy such as, but not limited to, NiFe, NiFeCo, CoFe, CoFeB, Co, Ni, Cu, Ta, Ti, Zr, Au, Ru, Cr, Pt, CoPt, CoCrPt, FeNi, FeTa, FeTaCr, FeAl, FeZr, NiFeCr, or NiFeX. In general, free layer 1410 comprises a ferromagnetic layer capable of changing magnetization state. In some embodiments, free layer 1410 is a composite free layer that includes multiple ferromagnetic and coupling sub-layers.

Figure 15:
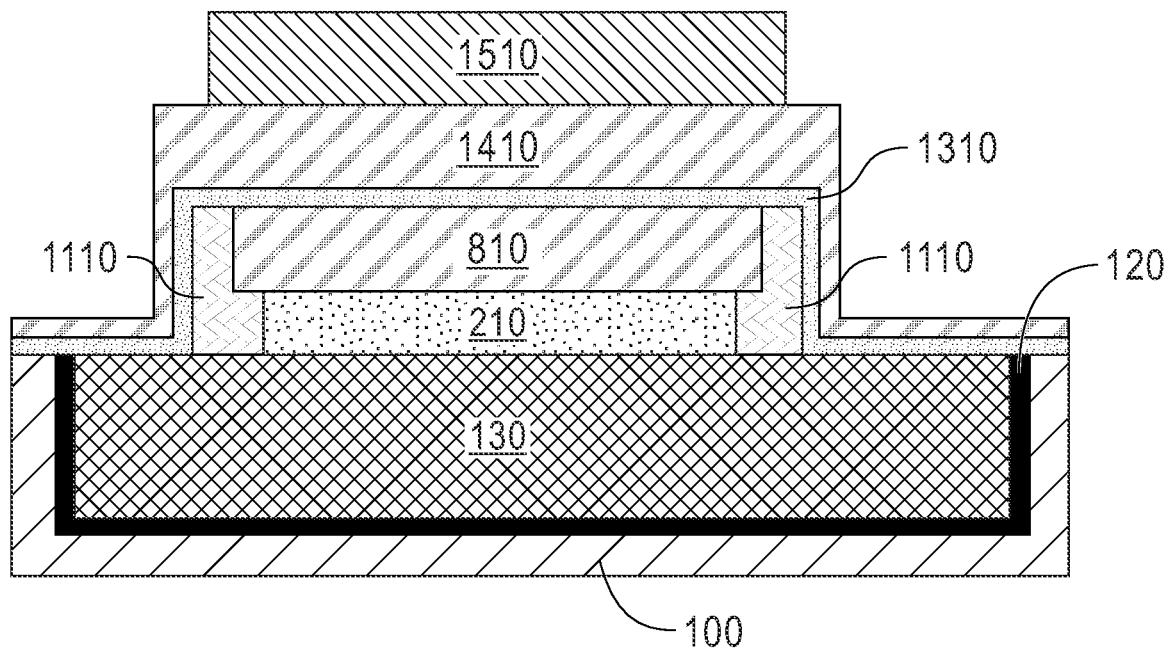
FIG. 15 depicts a process of forming and patterning a metal hardmask, in accordance with an embodiment of the invention.

FIG. 15 depicts a cross-sectional view of fabrication steps, in accordance with an embodiment of the present invention. FIG. 15 shows the formation and patterning of metal hardmask 1510.

Metal hardmask 1510 is deposited on exposed surfaces of the device. Metal hardmask 1510 may be formed by any known deposition process including, for example, CVD, PECVD, PVD, sputtering, ALD, or other like deposition processes. Metal hardmask 1510 may be formed of a metal such as, for example, tungsten, tantalum, hafnium, zirconium, niobium, titanium, titanium nitride, copper, or alloys comprising carbon. In some embodiments, metal hardmask 1510 is TaN, TiAlC, or TiC.

Subsequent to depositing a layer of metal hardmask 1510 material, lithography and etching (e.g., RIE, IBE) can be used to pattern metal hardmask 1510. In general, metal hardmask 1510 is patterned such that the width of metal hardmask 1510 is larger than the width of reference layer 810.

Figure 16:
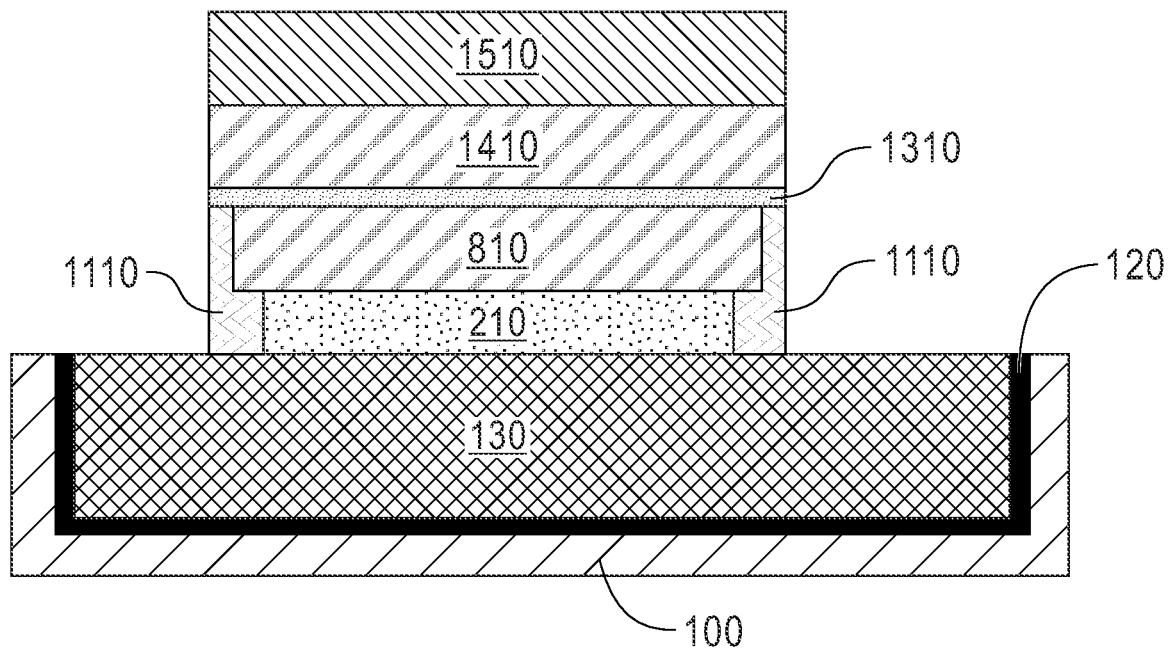
FIG. 16 depicts a process of removing portions of a free layer, a tunnel barrier, and a spacer layer that are not protected by a metal hardmask, in accordance with an embodiment of the invention.

FIG. 16 depicts a cross-sectional view of fabrication steps, in accordance with an embodiment of the present invention. FIG. 16 shows the removal of portions of free layer 1410, tunnel barrier 1310, and spacer layer 1110 that are not protected by metal hardmask 1510.

The removing of portions of free layer 1410, tunnel barrier 1310, and spacer layer 1110 can be performed using an etching process such as, for example, RIE or IBE. As free layer 1410 is wider than reference layer 810, and spacer layer 1110 is present on the sidewalls of reference layer 810 after the etching process, there is a reduced or eliminated risk of causing a short between reference layer 810 and free layer 1410.

Figure 17:
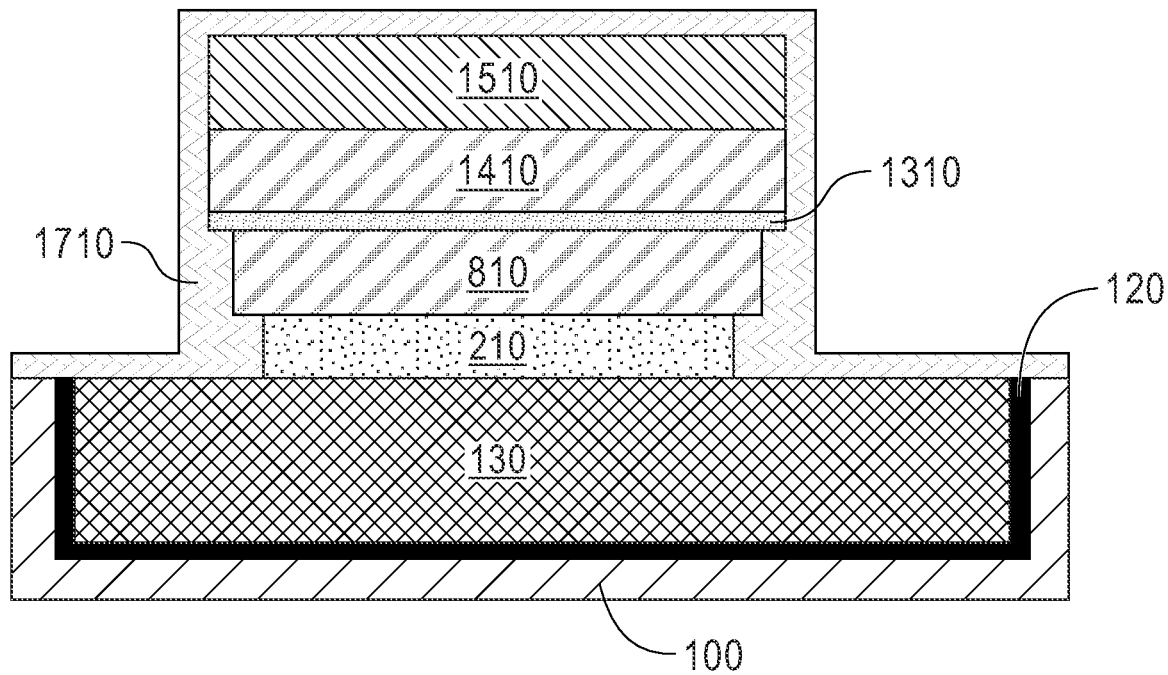
FIG. 17 depicts a process of forming a dielectric layer, in accordance with an embodiment of the invention.

FIG. 17 depicts a cross-sectional view of fabrication steps, in accordance with an embodiment of the present invention. FIG. 17 shows the formation of dielectric layer 1710.

Dielectric layer 1710 can be formed on exposed surfaces by providing a dielectric spacer material. One example of a dielectric material that may be employed in embodiments of the present invention is SiN. In general, the dielectric layer 1710 comprises any dielectric material including, for example, a dielectric nitride, dielectric oxide, and/or dielectric oxynitride. More specifically, the dielectric layer 1710 may be, for example, SiN, SiCN, SiNCH, SiBCN, SiBN, SiOCN, SiON, SiCO, or SiC. In one example, dielectric layer 1210 is composed of a non-conductive low capacitance dielectric material such as SiO2.

The dielectric material that provides dielectric layer 1710 may be provided by a deposition process including, for example, chemical vapor deposition (CVD), plasma enhanced chemical vapor deposition (PECVD), or physical vapor deposition (PVD).

Figure 18:
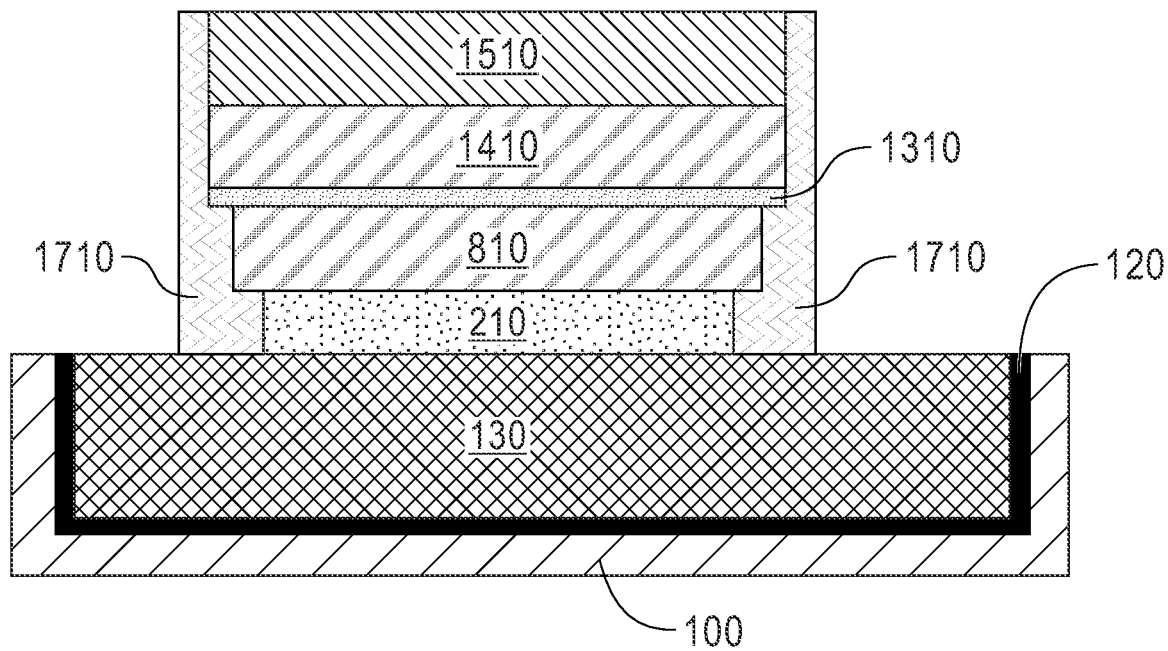
FIG. 18 depicts a process of etching back a dielectric layer, in accordance with an embodiment of the invention.

FIG. 18 depicts a cross-sectional view of fabrication steps, in accordance with an embodiment of the present invention. FIG. 18 shows the etch back of dielectric layer 1710.

The etch used may comprise a dry etching process such as, for example, RIE or IBE. In general, dielectric layer 1710 is etched such that top surfaces of metal hardmask 1510, substrate 100, liner 120, and bottom metal contact 130 are exposed.

Figure 19:
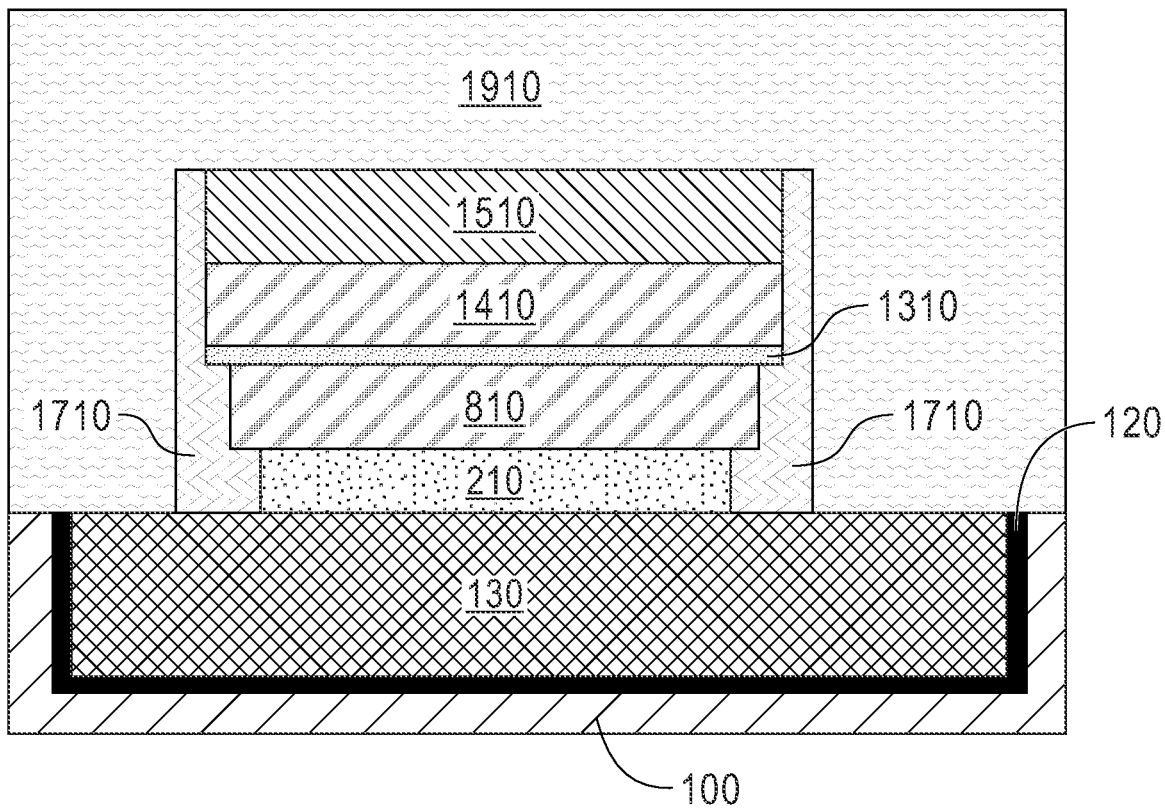
FIG. 19 depicts a process of forming an interlayer dielectric layer (ILD), in accordance with an embodiment of the invention.

FIG. 19 depicts a cross-sectional view of fabrication steps, in accordance with an embodiment of the present invention. FIG. 19 shows the formation of ILD 1910.

In general, ILD 1910 may be a non-crystalline solid material such as silicon dioxide (SiO2) undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. In another embodiment, a self-planarizing material such as a spin-on glass (SOG) or a spin-on low-κ dielectric material such as SiLK™ can be used as ILD 1910. The use of a self-planarizing dielectric material as ILD 1910 may avoid the need to perform a subsequent planarizing step.

In some embodiments, ILD 1910 is formed utilizing a deposition process including, for example, CVD, flowable chemical vapor deposition (fCVD), plasma enhanced chemical vapor deposition (PECVD), evaporation or spin-on coating. In some embodiments, particularly when non-self-planarizing dielectric materials are used as ILD 1910, a planarization process, such as CMP, or an etch back process follows the deposition of the dielectric material that provides ILD 1910.

Figure 20:
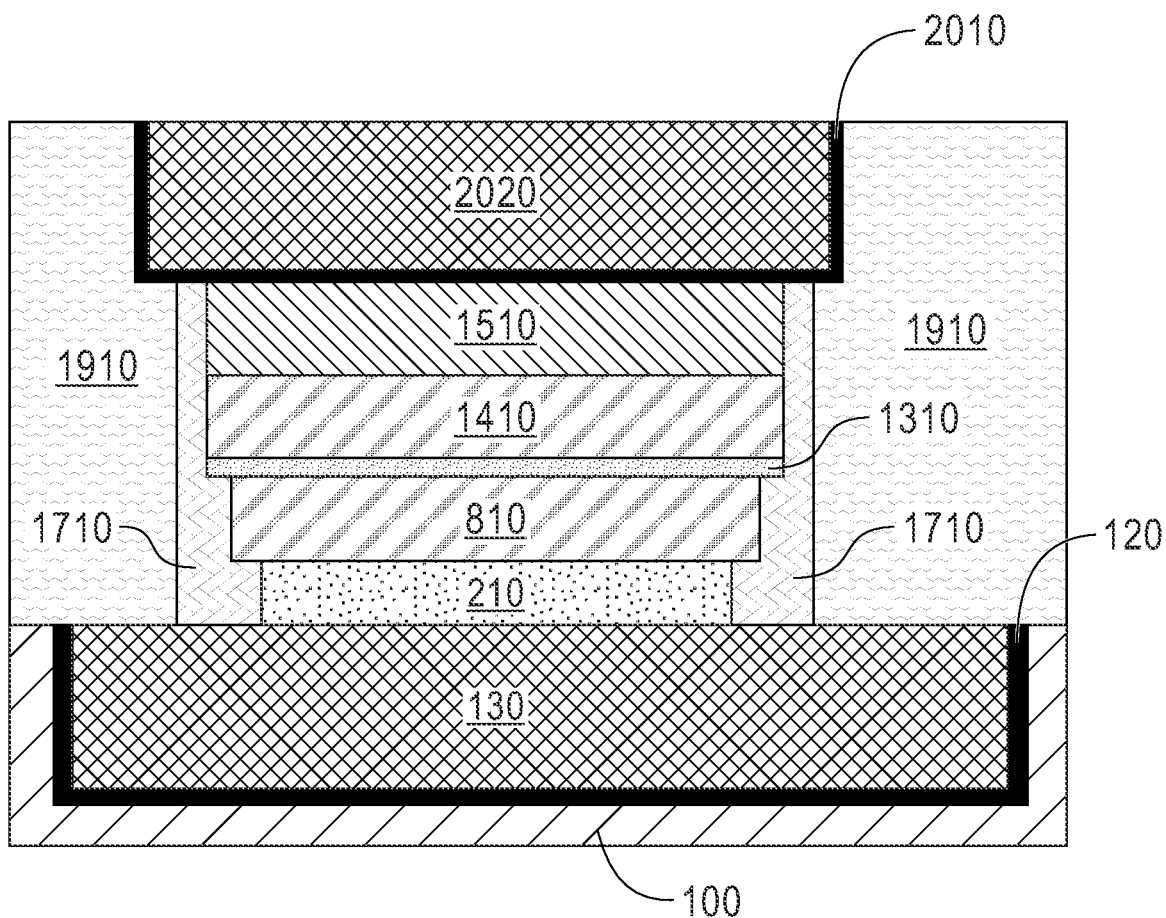
FIG. 20 depicts a process of removing portions of ILD and forming a liner and a contact, in accordance with an embodiment of the invention.

FIG. 20 depicts a cross-sectional view of fabrication steps, in accordance with an embodiment of the present invention. FIG. 20 shows the removal of portions of ILD 1910 and the formation of liner 2010 and contact 2020.

Liner 2010 may be formed in ILD 1910 by removing portions of ILD 1910 to form a contact trench. The contact trench may be formed in ILD 1910 based on the desired size and location of contact 2020.

In embodiments of the present invention, the contact trench may be formed by an etching process or a selective etching process that selectively removes ILD material from ILD 1910 within the trench. In some embodiments, this etching can be performed using an anisotropic etch such as RIE. Masking material (not shown) may be applied to the top of the device prior to etching each contact trench, which resists etching and can be utilized to form the desired shape of the contact trench, such as, for example, the shape depicted in FIG. 20. In some embodiments, the masking material may be a photoresist which has been patterned using photolithography.

Subsequent to creating the trench, liner 2010 is formed on ILD 1910 and metal hardmask 1510 by sputtering, CVD, or ALD and is a conductor such as TiN, TiAlC, TiC, or TaN. In some embodiments, liner 2010 may be comprised of other conductive materials such as Al, Cu, Ni, Co, Ru, or combinations thereof.

Contact 2020 may be formed by, for example, depositing a metal layer in the contact trenches. Any known deposition process may be utilized including, for example, CVD, PECVD, PVD, sputtering, ALD or other like deposition processes. Contact 2020 may be formed of a metal such as, for example, tungsten, tantalum, hafnium, zirconium, niobium, titanium, titanium nitride, copper, or alloys comprising carbon. After the contact metal used to form contact 2020 is deposited, CMP may be used to remove excess contact material stopping at the top of ILD 1910 such that the top surface of contact 2020 is coplanar with the top surface of ILD 1910.

As illustrated in FIG. 20, the depicted MRAM structure includes a reference layer 810 with a width smaller than a free layer 1410. Dielectric layer 1710 encapsulates the MTJ structure. Such an embodiment reduces or eliminates shorts between reference layer 810 and free layer 1410 that might otherwise be caused by re-sputtering of thick bottom metal layers onto the MTJ stack sidewalls.

FIGS. 21-34 depict embodiments of the present invention that are formed according a different fabrication process.

Figure 21:
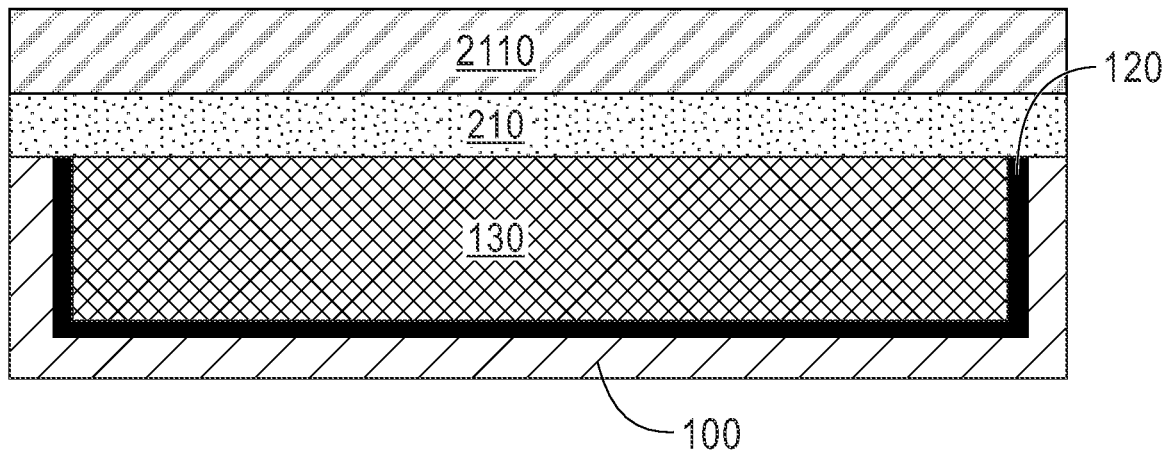
FIG. 21 depicts a process of forming a reference layer, in accordance with an embodiment of the invention.

The fabrication process depicted by FIG. 21 is performed on the same device originally depicted in FIGS. 1-2. Accordingly, the initial fabrication steps are similar to those already described with respect to FIGS. 1-2.

FIG. 21 depicts a cross-sectional view of fabrication steps, in accordance with an embodiment of the present invention. FIG. 21 shows the formation of reference layer 2110.

Reference layer 2110 is deposited on bottom electrode 210 and may be formed by any known deposition process including for example, CVD, PECVD, PVD, sputtering, ALD, or other like deposition processes. Reference layer 2110 may be formed of any ferromagnetic material or alloy such as, but not limited to, NiFe, NiFeCo, CoFe, CoFeB, Co, Ni, Cu, Ta, Ti, Zr, Au, Ru, Cr, Pt, CoPt, CoCrPt, FeNi, FeTa, FeTaCr, FeAl, FeZr, NiFeCr, or NiFeX. In general, reference layer 2110 comprises a ferromagnetic layer with a fixed magnetization state. In some embodiments, reference layer 2110 is composed of multiple sublayers that create a magnetically engineered structure fixing the magnetization orientation with a high magnetic energy barrier. For example, reference layer 2110 may comprise a reference magnetic layer coupled with a SAF layer. A thin coupling layer may be between the reference magnetic layer and the SAF layer.

Figure 22:
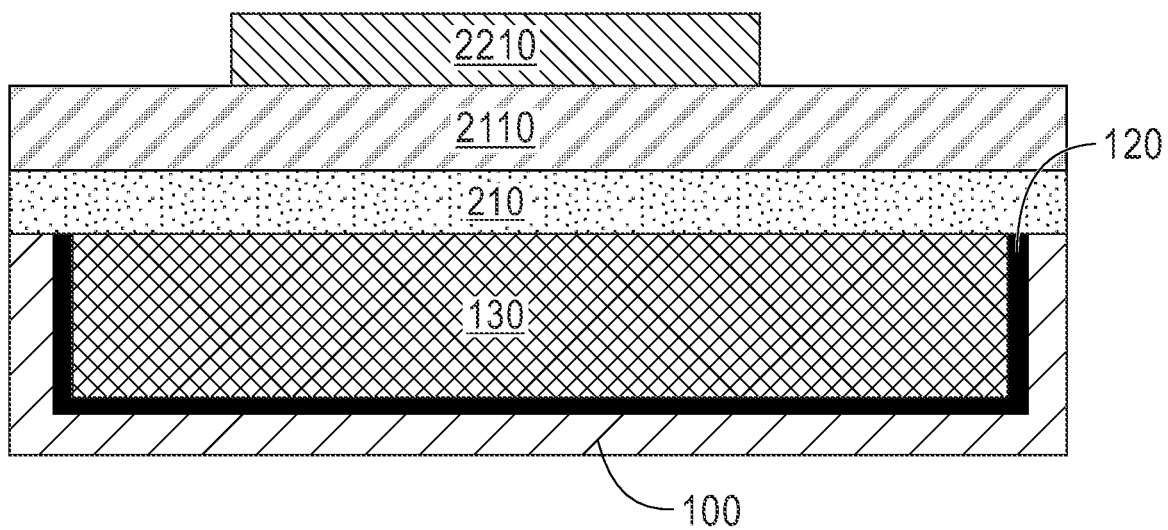
FIG. 22 depicts a process of forming a hardmask, in accordance with an embodiment of the invention.

FIG. 22 depicts a cross-sectional view of fabrication steps, in accordance with an embodiment of the present invention. FIG. 22 shows the formation of hardmask 2210.

Hardmask 2210 may be any hardmask material such as, for example, silicon dioxide and/or SiN. Hardmask 2210 can be formed by forming a blanket layer of material by any suitable deposition process such as, for example, CVD or PECVD.

After forming hardmask 2210, lithography and etching can be used to pattern hardmask 2210 such that the top surface of portions of reference layer 2110 are exposed. In the depicted embodiment, hardmask 2210 is patterned such that the width of hardmask 2210 corresponds to the desired width of reference layer 2110.

Figure 23:
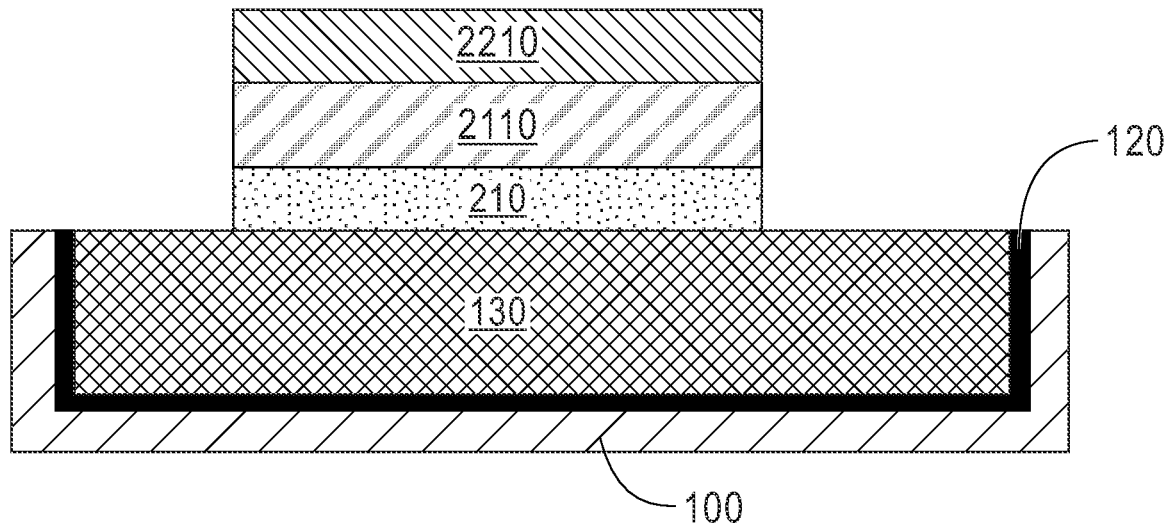
FIG. 23 depicts a process of removing portions of a reference layer and a bottom electrode that are not protected by a hardmask, in accordance with an embodiment of the invention.

FIG. 23 depicts a cross-sectional view of fabrication steps, in accordance with an embodiment of the present invention. FIG. 23 shows the removal of portions of reference layer 2110 and bottom electrode 210 not protected by hardmask 2210.

The removing of portions of reference layer 2110 and bottom electrode 210 not protected by hardmask 2210 can be performed using an etching process such as, for example, IBE or RIE. The portion of reference layer 2110 that remains corresponds to the size of the desired reference layer and bottom electrode for the device.

Figure 24:
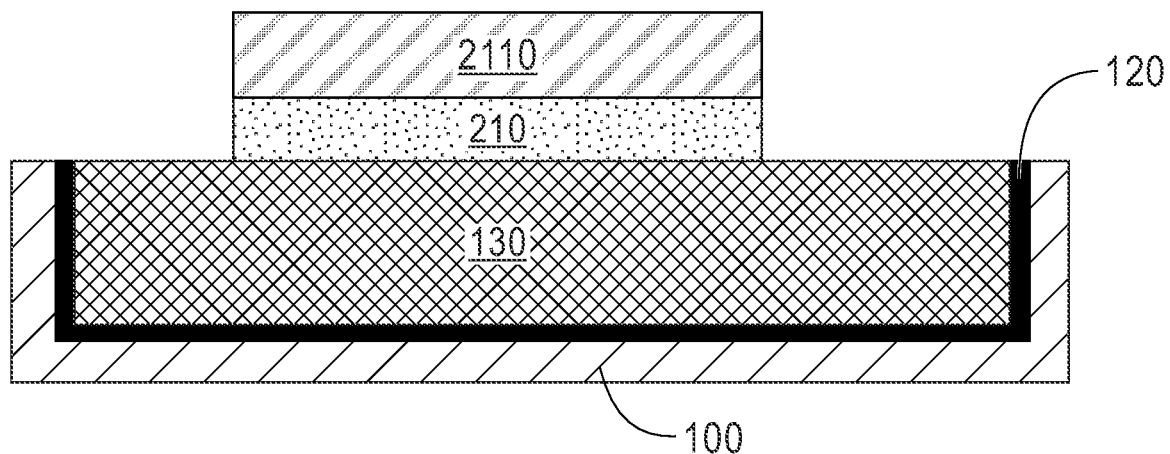
FIG. 24 depicts a process of removing a hardmask, in accordance with an embodiment of the invention.

FIG. 24 depicts a cross-sectional view of fabrication steps, in accordance with an embodiment of the present invention. FIG. 24 shows the removal of hardmask 2210.

In general, the process of removing hardmask 2210 involves the use of an etching process such as RIE, laser ablation, or any etch process which can be used to selectively remove a portion of material, such as hardmask 2210.

Figure 25:
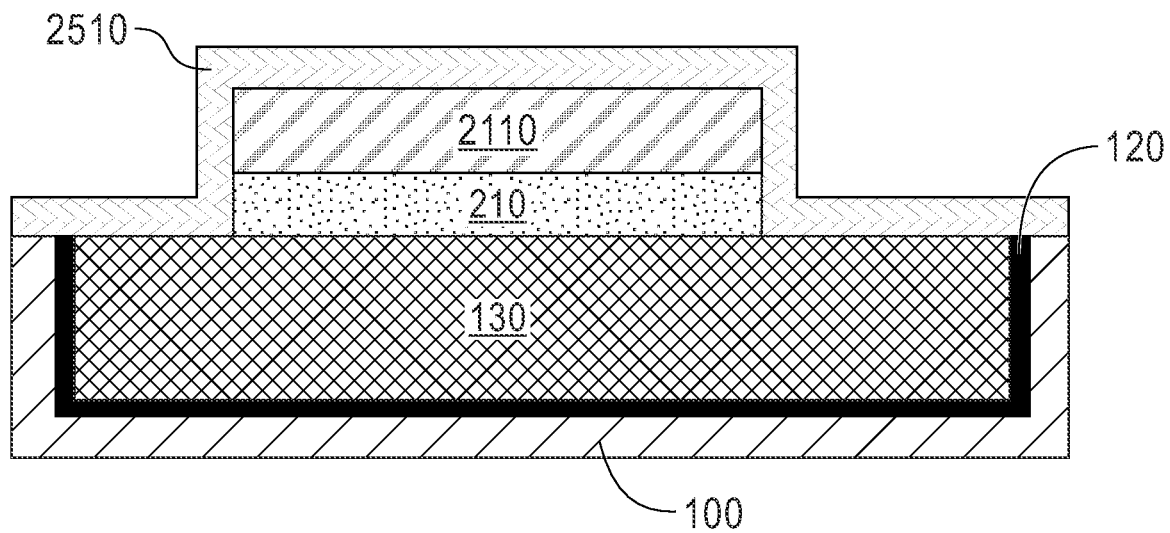
FIG. 25 depicts a process of forming a spacer layer, in accordance with an embodiment of the invention.

FIG. 25 depicts a cross-sectional view of fabrication steps, in accordance with an embodiment of the present invention. FIG. 25 shows the formation of spacer layer 2510.

Figure 26:
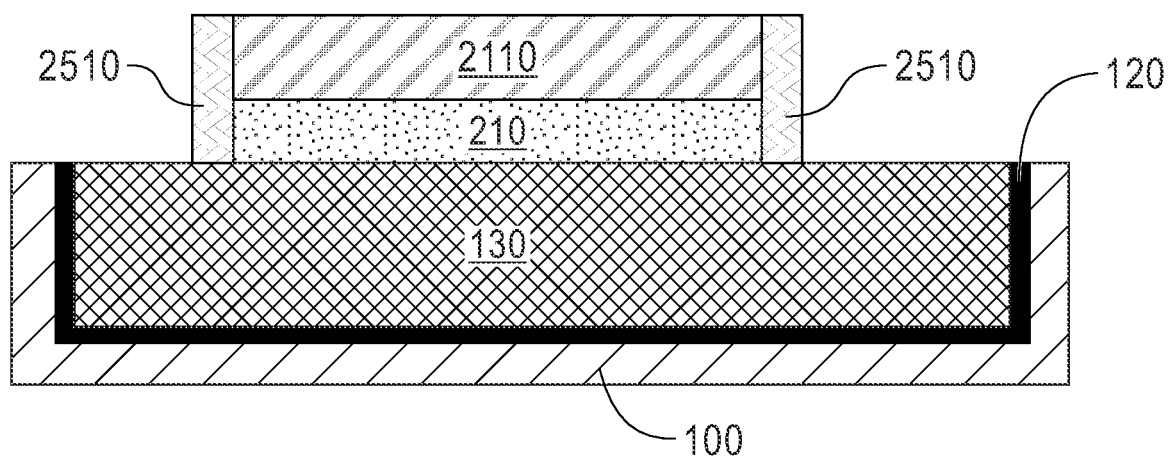
FIG. 26 depicts a process of removing portions of a spacer layer, in accordance with an embodiment of the invention.

Spacer layer 2510 can be formed on exposed surfaces by first providing a dielectric spacer material and then, as shown in FIG. 26, etching the dielectric spacer material. One example of a dielectric spacer material that may be employed in embodiments of the present invention is SiN. In general, spacer layer 2510 comprises any dielectric spacer material including, for example, a dielectric nitride, dielectric oxide, and/or dielectric oxynitride. More specifically, the spacer layer 2510 may be, for example, SiCN, SiNCH, SiBCN, SiBN, SiOCN, SiON, SiCO, or SiC. In one example, the dielectric spacer material is composed of a non-conductive low capacitance dielectric material such as $SiO_2$.

The dielectric spacer material that provides spacer layer 2510 may be provided by a deposition process including, for example, CVD, PECVD, or PVD. The etch used to provide spacer layer 2510 may comprise a dry etching process such as, for example, reactive ion etching. In some embodiments, spacer layer 2510 is formed by sputtering or ALD.

FIG. 26 depicts a cross-sectional view of fabrication steps, in accordance with an embodiment of the present invention. FIG. 26 shows the removal of the horizontal portions of spacer layer 2510.

More particularly, portions of dielectric spacer material on the top surfaces of bottom metal contact 130 and reference layer 2110 are removed such that what remains of spacer layer 2510 is present on the sidewalls of reference layer 2110.

The portions of spacer layer 2510 may be removed utilizing a directional or anisotropic etching process such as RIE. In one example, gas cluster IBE may be used to remove spacer layer 2510 from the top surfaces of bottom metal contact 130 and reference layer 2110. The removal of spacer layer 2510 from the top surfaces of bottom metal contact 130 and reference layer 2110 re-exposes the top surfaces of bottom metal contact 130 and reference layer 2110.

Figure 27:
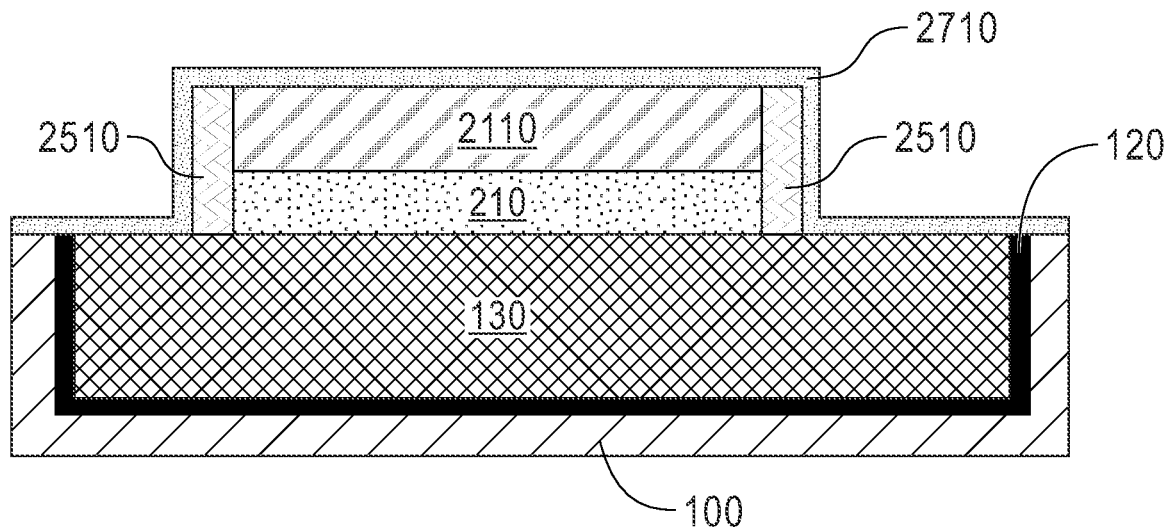
FIG. 27 depicts a process of forming a tunnel barrier, in accordance with an embodiment of the invention.

FIG. 27 depicts a cross-sectional view of fabrication steps, in accordance with an embodiment of the present invention. FIG. 27 shows the formation of tunnel barrier 2710.

Tunnel barrier 2710 is deposited on exposed surfaces. Tunnel barrier 2710 may be formed by any known known deposition process including, for example, CVD, PECVD, PVD, sputtering, ALD, or other like deposition processes. Tunnel barrier 2710 can be formed from an oxide material or other suitable electrical insulator. Tunnel barrier 2710 may be formed of, for example, (MgO or $Al_2O_3$ Tunnel barrier 2710 is typically very thin, oftentimes only a few nanometers thick, such that electrons can tunnel from one ferromagnet (e.g., a free layer) to the next (e.g., reference layer 2110).

Figure 28:
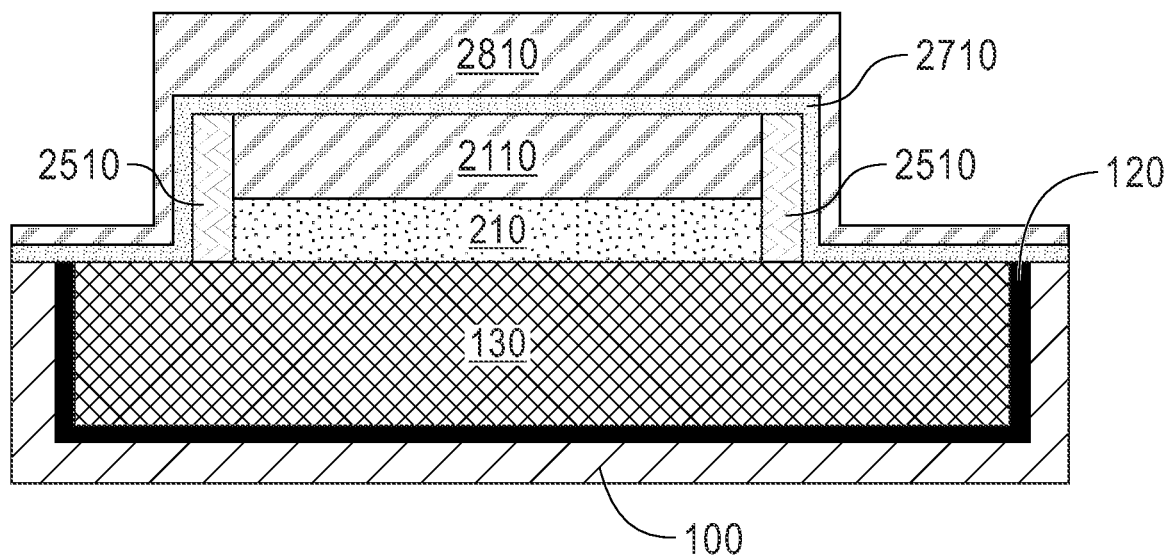
FIG. 28 depicts a process of forming a free layer, in accordance with an embodiment of the invention.

FIG. 28 depicts a cross-sectional view of fabrication steps, in accordance with an embodiment of the present invention. FIG. 28 shows the formation of free layer 2810.

Free layer 2810 is deposited on tunnel barrier 2710. Free layer 2810 may be formed by any known deposition process including, for example, CVD, PECVD, PVD, sputtering, ALD, or other like deposition processes. Free layer 2810 may be formed of any ferromagnetic material or alloy such as, but not limited to, NiFe, NiFeCo, CoFe, CoFeB, Co, Ni, Cu, Ta, Ti, Zr, Au, Ru, Cr, Pt, CoPt, CoCrPt, FeNi, FeTa, FeTaCr, FeAl, FeZr, NiFeCr, or NiFeX. In general, free layer 2810 comprises a ferromagnetic layer capable of changing magnetization state. In some embodiments, free layer 2810 is a composite free layer that includes multiple ferromagnetic and coupling sub-layers.

Figure 29:
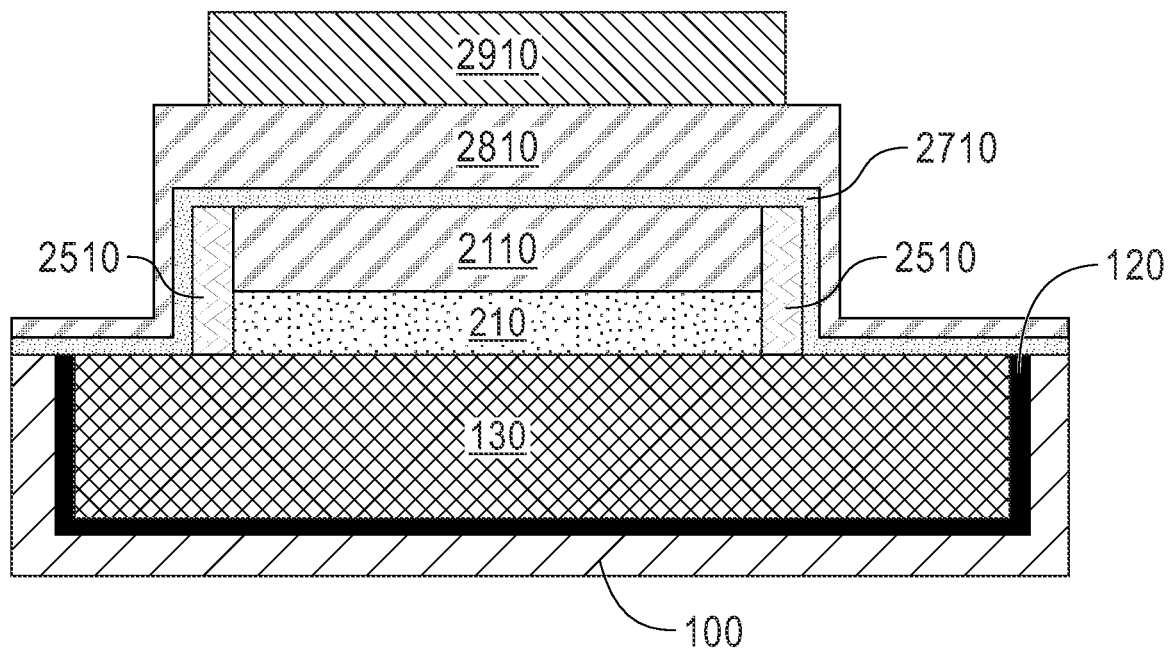
FIG. 29 depicts a process of forming and patterning a metal hardmask, in accordance with an embodiment of the invention.

FIG. 29 depicts a cross-sectional view of fabrication steps, in accordance with an embodiment of the present invention. FIG. 29 shows the formation and patterning of metal hardmask 2910.

Metal hardmask 2910 is deposited on exposed surfaces of the device. Metal hardmask 2910 may be formed by any known deposition process including, for example, CVD, PECVD, PVD, sputtering, ALD, or other like deposition processes. Metal hardmask 2910 may be formed of a metal such as, for example, tungsten, tantalum, hafnium, zirconium, niobium, titanium, titanium nitride, copper, or alloys comprising carbon. In some embodiments, metal hardmask 2910 is TaN, TiAlC, or TiC.

Subsequent to depositing a layer of metal hardmask 2910 material, lithography and etching (e.g., RIE, IBE) can be used to pattern metal hardmask 2910. In general, metal hardmask 2910 is patterned such that the width of metal hardmask 2910 is larger than the width of reference layer 2110.

Figure 30:
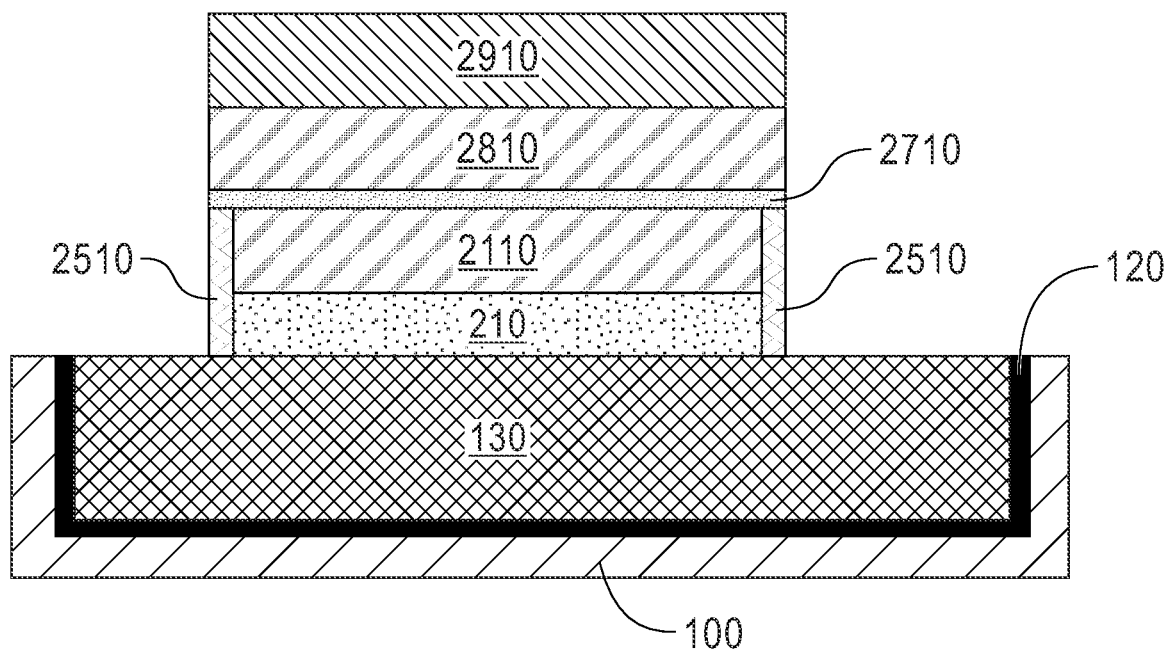
FIG. 30 depicts a process of removing portions of a free layer, a tunnel barrier, and a spacer layer that are not protected by a metal hardmask, in accordance with an embodiment of the invention.

FIG. 30 depicts a cross-sectional view of fabrication steps, in accordance with an embodiment of the present invention. FIG. 30 shows the removal of portions of free layer 2810, tunnel barrier 2710, and spacer layer 2510 that are not protected by metal hardmask 2910.

The removing of portions of free layer 2810, tunnel barrier 2710, and spacer layer 2510 can be performed using an etching process such as, for example, RIE or IBE. As free layer 2810 is wider than reference layer 2110, and spacer layer 2510 is present on the sidewalls of reference layer 2110 after the etching process, there is a reduced or eliminated risk of causing a short between reference layer 2110 and free layer 2810.

Figure 31:
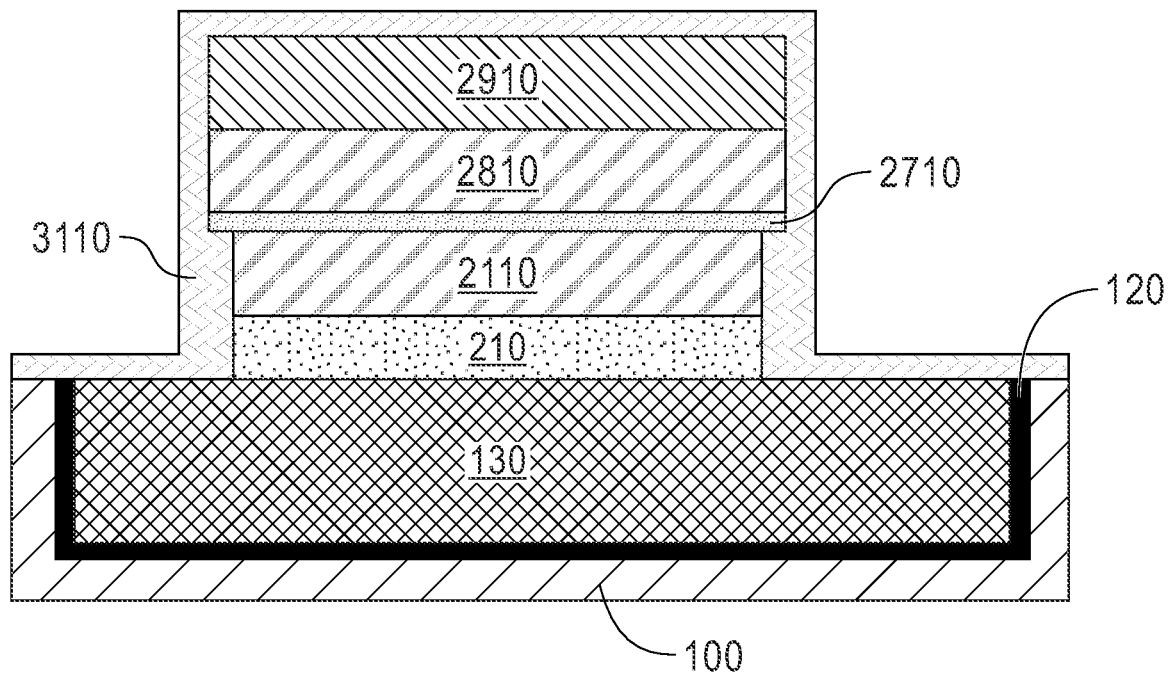
FIG. 31 depicts a process of forming a dielectric layer, in accordance with an embodiment of the invention.

FIG. 31 depicts a cross-sectional view of fabrication steps, in accordance with an embodiment of the present invention. FIG. 31 shows the formation of dielectric layer 3110.

Dielectric layer 3110 can be formed on exposed surfaces by providing a dielectric spacer material. One example of a dielectric material that may be employed in embodiments of the present invention is SiN. In general, the dielectric layer 3110 comprises any dielectric material including, for example, a dielectric nitride, dielectric oxide, and/or dielectric oxynitride. More specifically, the dielectric layer 3110 may be, for example, SiN, SiCN, SiNCH, SiBCN, SiBN, SiOCN, SiON, SiCO, or SiC. In one example, dielectric layer 3110 is composed of a non-conductive low capacitance dielectric material such as SiO2.

The dielectric material that provides dielectric layer 3110 may be provided by a deposition process including, for example, chemical vapor deposition (CVD), plasma enhanced chemical vapor deposition (PECVD), or physical vapor deposition (PVD).

Figure 32:
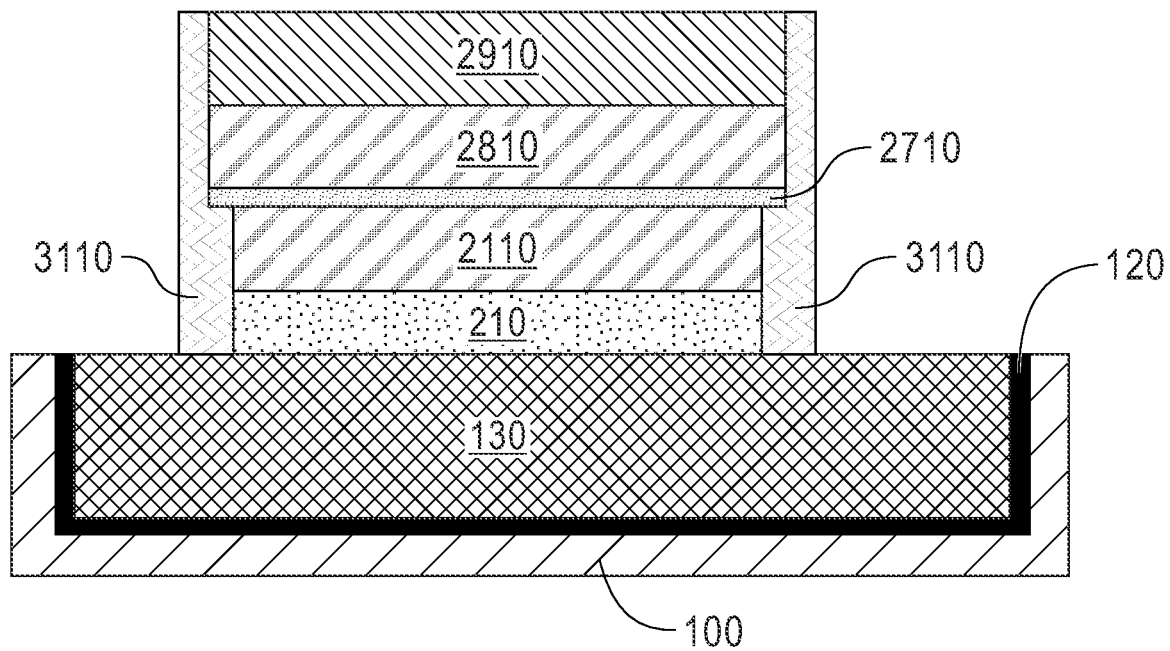
FIG. 32 depicts a process of etching back a dielectric layer, in accordance with an embodiment of the invention.

FIG. 32 depicts a cross-sectional view of fabrication steps, in accordance with an embodiment of the present invention. FIG. 32 shows the etch back of dielectric layer 3110.

The etch used may comprise a dry etching process such as, for example, RIE or IBE. In general, dielectric layer 3110 is etched such that top surfaces of metal hardmask 2910, substrate 100, liner 120, and bottom metal contact 130 are exposed.

Figure 33:
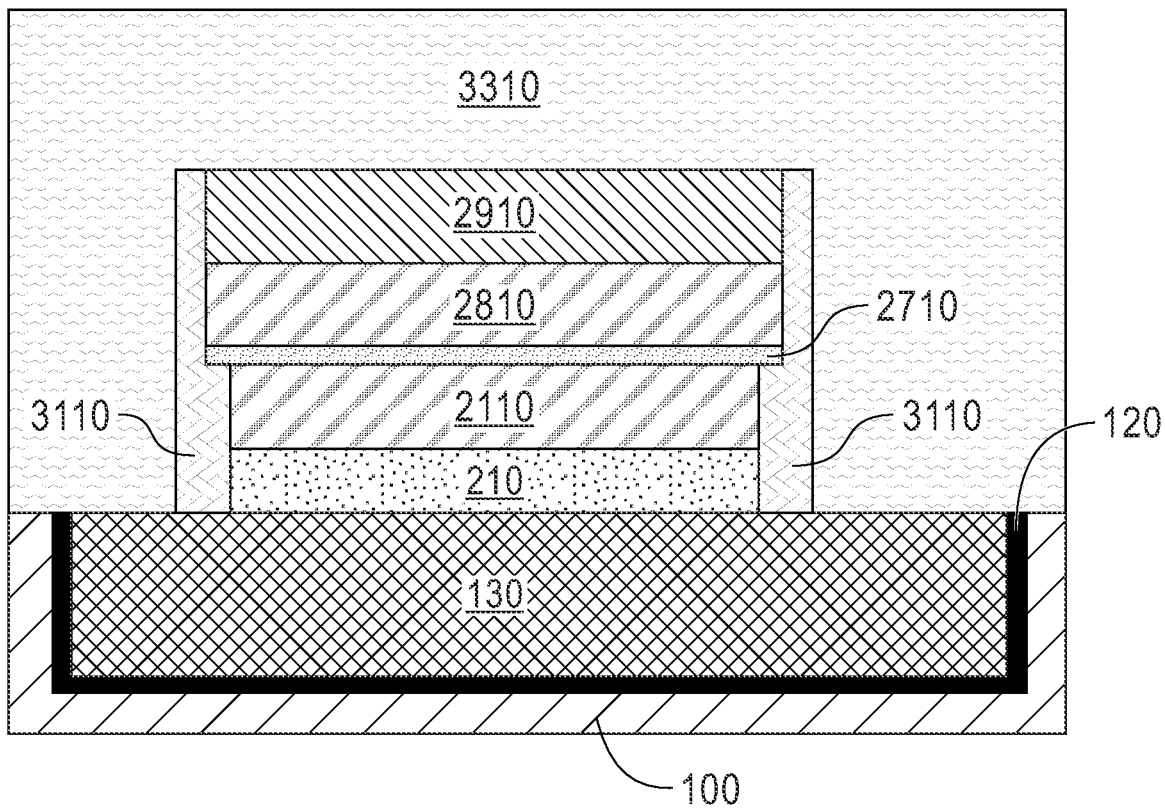
FIG. 33 depicts a process of forming ILD, in accordance with an embodiment of the invention.

FIG. 33 depicts a cross-sectional view of fabrication steps, in accordance with an embodiment of the present invention. FIG. 33 shows the formation of ILD 3310.

In general, ILD 3310 may be a non-crystalline solid material such as SiO2 USG, FSG, BPSG, a spin-on low-κ dielectric layer, a CVD low-κ dielectric layer or any combination thereof. In another embodiment, a self-planarizing material such as a SOG or a spin-on low-κ dielectric material such as SiLK™ can be used as ILD 3310. The use of a self-planarizing dielectric material as ILD 3310 may avoid the need to perform a subsequent planarizing step.

In some embodiments, ILD 3310 is formed utilizing a deposition process including, for example, CVD, fCVD, PECVD, evaporation or spin-on coating. In some embodiments, particularly when non-self-planarizing dielectric materials are used as ILD 3310, a planarization process, such as CMP, or an etch back process follows the deposition of the dielectric material that provides ILD 3310.

Figure 34:
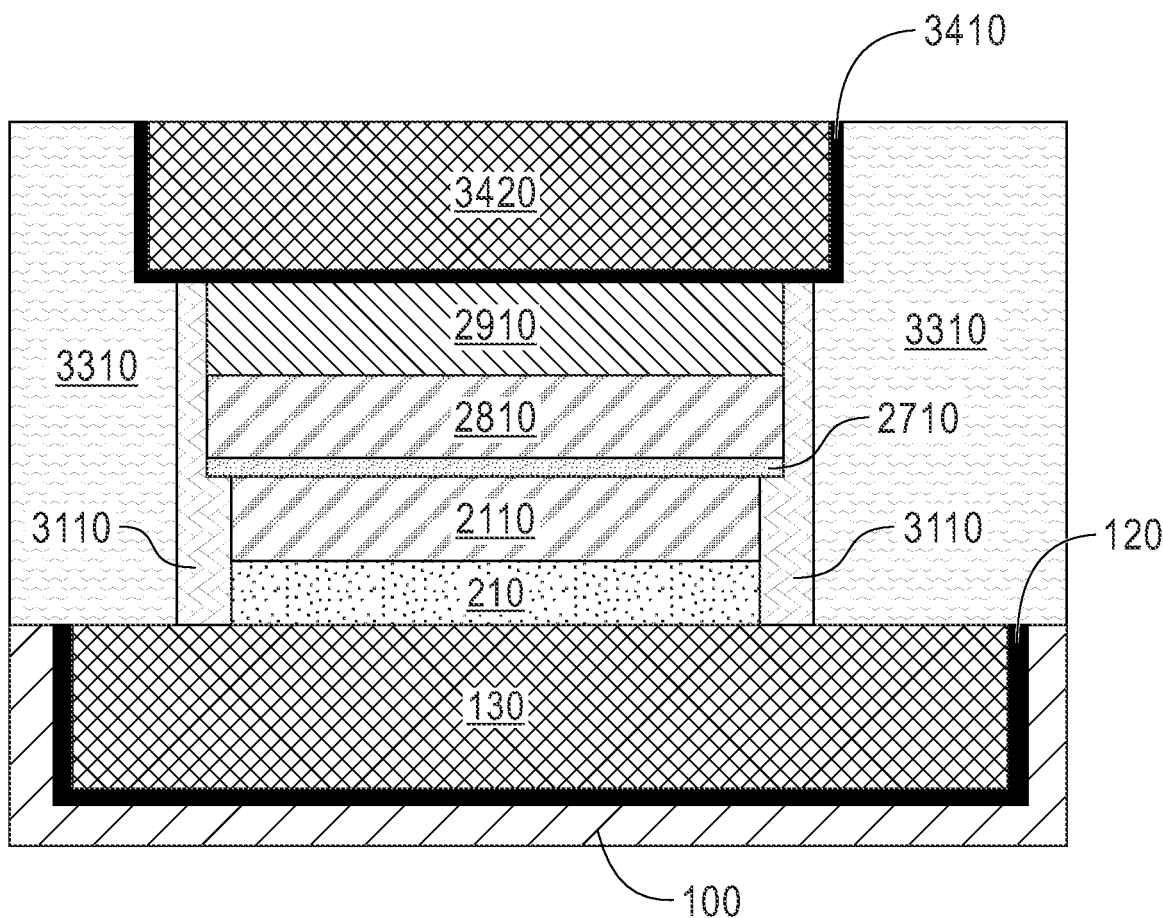
FIG. 34 depicts a process of removing portions of ILD and the formation of a liner and a contact, in accordance with an embodiment of the invention.

FIG. 34 depicts a cross-sectional view of fabrication steps, in accordance with an embodiment of the present invention. FIG. 34 shows the removal of portions of ILD 3310 and the formation of liner 3410 and contact 3420.

Liner 3410 may be formed in ILD 3310 by removing portions of ILD 3310 to form a contact trench. The contact trench may be formed in ILD 3310 based on the desired size and location of contact 3420.

In embodiments of the present invention, the contact trench may be formed by an etching process or a selective etching process that selectively removes ILD material from ILD 3310 within the trench. In some embodiments, this etching can be performed using an anisotropic etch such as RIE. Masking material (not shown) may be applied to the top of the device prior to etching each contact trench, which resists etching and can be utilized to form the desired shape of the contact trench, such as, for example, the shape depicted in FIG. 34. In some embodiments, the masking material may be a photoresist which has been patterned using photolithography.

Subsequent to creating the trench, liner 3410 is formed on ILD 3310 and metal hardmask 2910 by sputtering, CVD, or ALD and is a conductor such as TiN, TiAlC, TiC, or TaN. In some embodiments, liner 3410 may be comprised of other conductive materials such as Al, Cu, Ni, Co, Ru, or combinations thereof.

Contact 3420 may be formed by, for example, depositing a metal layer in the contact trenches. Any known deposition process may be utilized including, for example, CVD, PECVD, PVD, sputtering, ALD or other like deposition processes. Contact 3420 may be formed of a metal such as, for example, tungsten, tantalum, hafnium, zirconium, niobium, titanium, titanium nitride, copper, or alloys comprising carbon. After the contact metal used to form contact 3420 is deposited, CMP may be used to remove excess contact material stopping at the top of ILD 3310 such that the top surface of contact 3420 is coplanar with the top surface of ILD 3310.

As illustrated in FIG. 34, the depicted MRAM structure includes a reference layer 2110 with a width smaller than a free layer 2810. Dielectric layer 3110 encapsulates the MTJ structure. Such an embodiment reduces or eliminates shorts between reference layer 2110 and free layer 2810 that might otherwise be caused by re-sputtering of thick bottom metal layers onto the MTJ stack sidewalls.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
 a magnetoresistive random-access memory (MRAM) cell, comprising:
  a free layer above a reference layer and separated from the reference layer by a tunnel barrier, wherein a width of the reference layer is less than a width of the free layer;
  a bottom electrode under the reference layer, wherein:
   a largest width of the bottom electrode is less than the width of the reference layer; and
   the reference layer comprises a ferromagnetic material with a fixed magnetization state; and
  a dielectric spacer directly contacting: (i) a top surface of a bottom metal contact directly in contact with and beneath the bottom electrode, (ii) sidewalls of the free layer, the reference layer, the tunnel barrier, and the bottom electrode, and (iii) bottom surfaces of the tunnel barrier and the reference layer.

2. The semiconductor structure of claim 1, further comprising:
 a metal hardmask on the free layer.

3. The semiconductor structure of claim 2, further comprising:
 a metal contact on the metal hardmask.

4. The semiconductor structure of claim 2, wherein sidewalls of the metal hardmask are coplanar with sidewalls of the free layer.

5. The semiconductor structure of claim 1, wherein the bottom electrode is tungsten nitride (WN).

6. The semiconductor structure of claim 1, wherein the dielectric spacer is SiNCH.

7. The semiconductor structure of claim 1, further comprising:
 a metal hardmask on the free layer, wherein a smallest width of the metal hardmask is greater than the largest width of the bottom electrode.

* * * * *